United States Patent [19]

Inoue et al.

[11] Patent Number: 5,541,454
[45] Date of Patent: Jul. 30, 1996

[54] SEMICONDUCTOR DEVICE CONTAINING ELECTROSTATIC CAPACITIVE ELEMENT AND METHOD FOR MANUFACTURING SAME

[75] Inventors: Shunsuke Inoue, Atsugi; Yukihiko Sakashita, Isehara; Yoshio Nakamura, Atsugi; Shin Kikuchi; Hiroshi Yuzurihara, both of Isehara, all of Japan

[73] Assignee: Canon Kabushiki Kaisha, Tokyo, Japan

[21] Appl. No.: 478,115

[22] Filed: Jun. 7, 1995

Related U.S. Application Data

[63] Continuation of Ser. No. 110,194, Aug. 23, 1993, abandoned, which is a continuation of Ser. No. 707,330, May 29, 1991, abandoned.

[30] Foreign Application Priority Data

May 31, 1990 [JP] Japan .................................. 2-139615
May 31, 1990 [JP] Japan .................................. 2-139619
Nov. 16, 1990 [JP] Japan .................................. 2-308544

[51] Int. Cl.$^6$ ............................. H01L 23/48; H01L 23/52
[52] U.S. Cl. ............................ 257/767; 257/758; 257/306
[58] Field of Search ............................ 357/23.6; 257/296, 257/306, 310, 758, 767

[56] References Cited

U.S. PATENT DOCUMENTS

| | | | |
|---|---|---|---|
| 4,115,795 | 9/1978 | Masuoka et al. | 357/236 |
| 4,169,270 | 9/1979 | Hayes | 257/774 |
| 4,352,239 | 10/1982 | Pierce | 257/767 |
| 4,460,911 | 7/1984 | Salters | 257/306 |
| 4,481,283 | 11/1984 | Kerr et al. | 257/758 |
| 4,686,554 | 8/1987 | Ohmi et al. | 357/30 |
| 4,791,469 | 12/1988 | Ohmi et al. | 357/30 |
| 4,811,076 | 3/1989 | Tigelaar et al. | 257/306 |
| 4,899,206 | 2/1990 | Sakurai et al. | 357/67 |
| 4,916,512 | 4/1990 | Ohmi et al. | 357/30 |

FOREIGN PATENT DOCUMENTS

| | | |
|---|---|---|
| 3929129 | 4/1990 | Germany . |
| 58-215067 | 12/1983 | Japan . |
| 61-156865 | 7/1986 | Japan . |
| 62-259466 | 11/1987 | Japan . |
| 1-37051 | 2/1989 | Japan . |
| 1-120035 | 3/1989 | Japan . |
| 3-30474 | 2/1991 | Japan . |
| 2119570 | 4/1983 | United Kingdom . |

OTHER PUBLICATIONS

S. M. Sze, *Semiconductor Devices Physics and Technology* John Wiley & Sons (New York) 1985 pp. 372–373.
T. F. Deutsch et al., "Laser Photo deposition of metal films with microscopic flatomer", *Applied Physics Letters* vol. 35 (25 Jul. 1979) pp. 175–177.
Patent Abstracts of Japan, vol. 13, No. 578 (E–864) (3926) Dec. 20, 1989 & JP–A–1 241 857 (Toshiba) Sep. 26, 1989.
Patent Abstracts of Japan, vol. 13, No. 166 (E–764) Apr. 20, 1989 & JP–A–64 000 756 (Hitachi, Ltd.) Jan. 5, 1989.
Tsubouchi et al., "Complete Planarization of Via Holes With Aluminum by Selective and Nonselective Chemical Vapor Deposition." Appl. Phys. Letter 57 Sep. 1990 P.1221 P.1223.
Masu et al., "Selective Deposition of Aluminum from Selectively Excited Metalorganic Source by the RF Plasma." *Appl. Phys. Lett.* 56 Apr. 1990 p. 1543, p. 1545.
Sekiguchi et al., "Epitaxial Growth of Al (100) on Si (100) by Gas–Temperature–Controlled Chemical Vapor Deposition." JJAP, 1989 p. 29, p. 31.

*Primary Examiner*—J. Carroll
*Attorney, Agent, or Firm*—Fitzpatrick, Cella, Harper & Scinto

[57] ABSTRACT

A semiconductor device comprises a capacitor consisting of an Al region formed on a semiconductor substrate, an Al oxide film formed on a surface of said Al region, and electrodes opposed to said Al region with interposition of said Al oxide film.

1 Claim, 14 Drawing Sheets

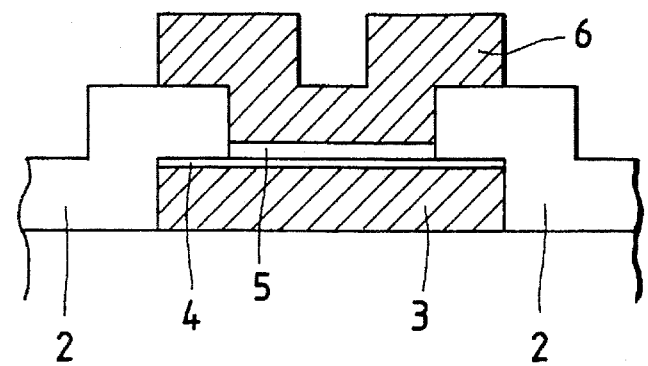
FIG. 12
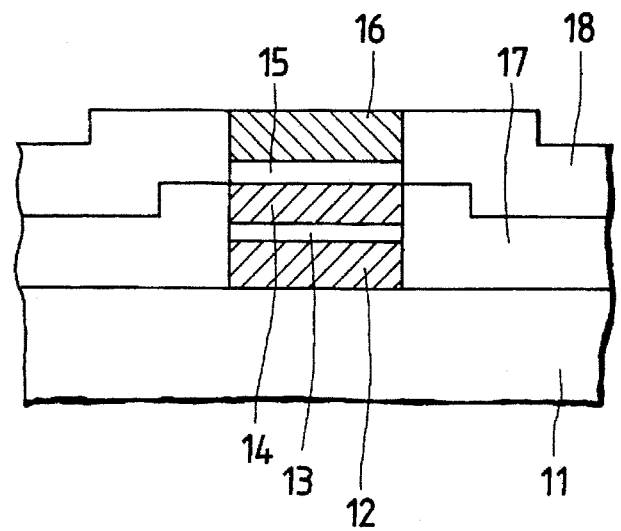
FIG. 13
FIG. 14
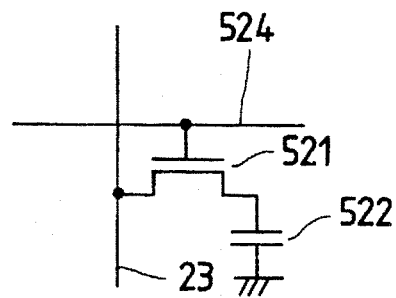
FIG. 15
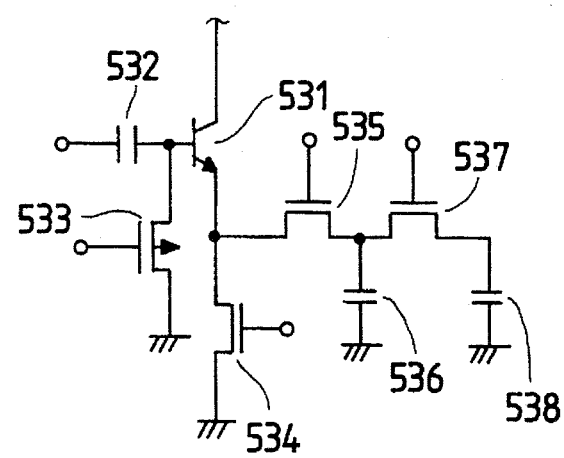

5,541,454

SEMICONDUCTOR DEVICE CONTAINING ELECTROSTATIC CAPACITIVE ELEMENT AND METHOD FOR MANUFACTURING SAME

This application is a continuation, of application Ser. No. 08/110,194 filed Aug. 23, 1993, now abandoned, which is a continuation of application Ser. No. 07/707,330 filed May 29, 1991, now abandoned.

BACKGROUND OF THE INVENTION

1. Field of the Invention

The present invention relates to a semiconductor integrated circuit device such as a memory, a photoelectric device and a signal processing device mounted on various electronic equipment and a method for manufacturing it, and more particularly to a semiconductor device incorporating electrostatic capacitive element and a method for manufacturing it.

2. Related Background Art

There is a semiconductor integrated circuit incorporating a number of electrostatic capacitive elements. Recently, along with the emergence of higher density and higher speed integrated circuits, a capacitive element of smaller size and with larger capacity is sought.

FIG. 1 is a typical cross-sectional view of a MOS capacitor generally used in an integrated circuit, and FIG. 2 is its equivalent circuit. This MOS capacitor comprises a lower electrode layer of an n+ layer 103 formed on an n− layer 102 buried into a p-type substrate 101, an upper electrode 105 via a dielectric layer 104 and an extraction electrode 106 from the n+ layer. An A terminal and a B terminal in the equivalent circuit correspond to the upper electrode 105 and the lower extraction electrode 106, respectively. As shown in the equivalent circuit, since an electric conductor such as an n+ diffusion layer is used as the lower electrode, parasitic devices such as a diode D and a capacitor Ccs are produced relative to the substrate, and there is a resistive component R1 due to the n+ diffusion layer between a capacitor $C_1$ and the B terminal. Also, as the upper electrode, Al or polysilicon is generally used, but when polysilicon is used, a resistive component R2 due to polysilicon is added between the A terminal and the capacitor $C_1$.

Accordingly, when MOS capacitor is used, as parasitic devices such as a resistor, capacitor and diode are contained other than the capacitor $C_1$, the frequency characteristics of the MOS capacitor are restricted under the influence of those parasitic devices.

Also, when one terminal of capacitive element is used at a high impedance, the capacity division with $C_1$ and Ccs is caused owing to the parasitic element Ccs.

Moreover, depending on the polarity of applied voltage, the capacity value is changed with the voltage due to the CV characteristics of MOS structure.

FIG. 3 is a typical cross-sectional view of a pn junction capacitor generally used for an integrated circuit, and FIG. 4 is its equivalent circuit. This capacitor comprises an n layer 102, a p layer 107 and n+ layers 103, 108 formed on a p-type substrate 101, and electrodes 109, 110 opposed via a dielectric layer 104.

Numerals of a structure as shown in FIG. 3 correspond to those of terminals in the equivalent circuit. The capacitance between terminals X and Y is $C_2+C_3$, but any pn junction can be used as capacitor.

As the pn junction capacitor contains parasitic resistance and parasitic capacitance, the frequency characteristics are restricted due to their influences, and further the capacitance value largely depends on the voltage. Moreover, it can not be used except when the pn junction becomes bias.

FIG. 5 is a typical cross-sectional view of a capacitive element of metal-insulation film-metal structure which has been devised to improve disadvantages of the MOS capacitor or pn junction capacitor as above described.

This capacitive element comprises a surface metal (lower electrode) 202 formed on a semiconductor substrate 201, an interlayer insulation film 203, an upper layer metal (upper electrode) 204, and a thin insulation film (dielectric layer) 205 which is a capacitive portion.

As metal films of the upper and lower layers, Al or Al alloy formed by the magnetron sputtering method, tungsten, or tungsten formed by the chemical vapor deposition (CVD) method are used. As the thin insulation film 205 serving as a capacitor, $SiO_2$, $Si_3N_4$, or $Ta_2O_5$ formed by CVD, $Al_2O_3$ formed by anodizing, or a laminate made of a combination of those films can be used.

In this capacitive element, there is an advantage that parasitic capacitance or parasitic resistance may not be produced. However, in a conventional technology, the surface of electrode was coarse, so that it was difficult to increase the electrostatic capacity per unit area of capacitive element. That is, on an electrode surface formed by the conventional technology, hillocks 202A might be produced as shown on larger scale in FIG. 5, so that a problem arose such that if the thickness of dielectric layer 205 is made thinner to increase the electrostatic capacitance per unit area of capacitive element, the dielectric layer 205 may be broken at a position where hillock 202A is produced, or becomes extremely thin and thus has a lower electrical withstand voltage. In other words, a metal film formed by a conventional method such as sputtering method or CVD method became quite irregular on the surface of metal film, because the stress built up in the film might be dispersed in the form of hillocks with the heat processing after deposition, whereby it was difficult to form a thin insulation layer.

In a highly integrated circuit system, it is required to form the thin insulation layer uniformly at high dielectric constant. Particularly, with a capacitive element of Al-insulation layer-Al structure, if $Al_2O_3$ with a dielectric constant of 8 to 10 can be used as the insulation layer by anodizing Al, the degree of integration can be greatly improved. However, as described above, with the conventional technology, there were too many irregularities on the surface of Al, so that it was indispensable to form $Al_2O_3$ uniformly at practical yield.

On the other hand, as an electrostatic capacitive element used for a dynamic RAM, a circuit as shown in FIG. 6 is known in which a capacitor is connected to the drain side of MOSFET. FIG. 7 is one of the device structures for implementing that circuit, referred to as a stack type This structure includes a pMOSFET having a polysilicon gate 23 on a gate oxide film 22 formed on a p-type substrate 21, a source 24, a drain 25, a source electrode 26, a field oxide film 27, an oxide film 2 and an interlayer insulation film 29, and a capacitor composed of a polysilicon 30 provided in contact with the drain of pMOSFET, and a further polysilicon 32 provided via a dielectric film 31. A trench type as shown in FIG. 8 and a fin type as shown in FIG. 9 are obtained by deforming the shapes of respective polysilicon layers 30A, 32A and 30B, 32B as shown, in order to increase the capacitance of stack-type capacitor and decrease its size.

Apart from a desired improvement of electrostatic capacitive element itself as previously described, the increase of capacitance and the reduction of element area for capacitor became a large technical problem. However, in the stack-type as described above, the increase of capacitance and the reduction of element area for capacitor are not consistent, in the trench type, there is a problem of leakage in the capacitor, and in the fin type, there is a problem that the manufacturing process becomes complex because the shape of polysilicon is complex, so that it was difficult to provide a memory cell at lower price with increased degree of integration.

That is, with the conventional technique, as the constitution or manufacturing method for capacitor was not sufficient, it was difficult to form a capacitor with small occupying area and large capacitance at good yield.

In a semiconductor circuit, a storage element (thereafter referred to as a memory cell) having a circuit configuration as shown in FIG. 10 is known. A typical cross-sectional view of such a memory cell is shown in FIG. 11. As shown in FIG. 11, a capacitor C as capacitive element incorporated into the memory cell is constituted of a lower electrode 30, an upper electrode 32, and a dielectric film 31 formed between both electrodes 30, 32.

When the higher integration is required for such memory cell, it is necessary to reduce the plane area of capacitor C as capacitive portion in each bit. In order to operate the memory cell normally, it is necessary to build up the quantity of electric charge as much as about 200 fc in the capacitor C to secure the resistance against soft error due to the α ray emitted from a ceramic package of DRAM, for instance. If setting the power voltage at 5 V with this quantity of charge, and representing the capacitance between source and earth for the capacitor C as Cs, then $$Cs \geq 40 \text{ fF}$$

When the dielectric film 31 is a general Si oxide film, it is known that the electric field applicable to the dielectric film 31 is E<about 5 MV/cm because of the reliability for the Si oxide film. Thus, when a method for applying a voltage half the power voltage is used, the thickness of Si oxide film that can be sufficiently used as the dielectric film is presumed to be 50 Å. Since the dielectric constant ε r of Si oxide film is 3.7, it is necessary to secure the plane area of capacitor C as large as 6 μm$^2$ or more, in order to realize Cs≧40 fF. A memory cell comprising a capacitor having such a large plane area can not meet the recent requirements of higher degree of integration as above described. Thereby, with the capacitor C of laminated structure in the shape of downward or upward convex as shown in FIG. 11, for example, the necessary capacitance was secured by increasing the surface area without enlarging the projection plane area of capacitor C.

SUMMARY OF THE INVENTION

An object of the present invention is to provide a semiconductor device more suitable for higher integration than conventional one.

Another object of the present invention is to provide a more reliable semiconductor device than conventional one.

A further object of the present invention is to provide a method for manufacturing a semiconductor device with higher integration and more reliability than conventional one, at good yield.

Another object of the present invention is to provide a semiconductor device characterized by comprising a capacitor consisting of an Al region formed on a semiconductor substrate, an Al oxide film formed on a surface of said Al region, and an electrode opposed to said Al region with interposition of said Al oxide film.

Another object of the present invention is to provide a method for manufacturing a semiconductor device having a capacitor for accumulating electric charges, characterized by including a process of forming one of the electrodes constituting the capacitor by depositing Al or a metal with the base of Al, with the CVD method of using a gas of alkyl aluminum hydride and hydrogen, and a process of forming an aluminum oxide film on the surface of one of said electrodes.

In the present invention, since Al or Al alloy selectively deposited on a semiconductor substrate is used as a lower metal layer, an electrostatic capacitive element of Al-insulation film-Al structure having high withstand voltage and with high reliability can be formed at good yield. Also, as the Al electrode is used for both electrodes of the electrostatic capacitive element, the influences of diffusion resistance and junction capacitance can be eliminated, so that the influence of parasitic element can be reduced as compared with MOS capacitor and pn junction capacitor, whereby the frequency characteristics of capacitor can be improved.

Furthermore, the surface of Al electrode according to the present invention is quite flat, so that it is possible to make an insulation layer thinner than conventional one, and increase the electrostatic capacitance per unit area.

Furthermore, another object of the present invention is to provide a semiconductor device characterized by comprising a capacitor consisting of a longitudinal Al region formed on a semiconductor substrate, and an electrode opposed to said Al region with interposition of a dielectric layer.

In the present invention, since one electrode is formed as longitudinal structure on a semiconductor substrate, and as a result, a capacitor is made as longitudinal structure, it is possible to implement a semiconductor device having a small-sized capacitor with large capacity and excellent durability in the simple process.

Also, since an electrode material having excellent selectivity and of good quality can be deposited in forming electrodes constituting a capacitor, the capacitor having small occupying area can be formed at good yield.

Furthermore, another object of the present invention is to provide a semiconductor device and a method for manufacturing the same having a capacitor with the structure capable of accomplishing further higher degree of integration and fineness.

Another object of the present invention is to provide a semiconductor device characterized by comprising a capacitive element including a first electrode having a lower layer portion formed on a lower surface within an opening where the lower surface is exposed formed in an insulation film on the conductive lower surface and an upper layer portion extending out in a direction from said lower layer portion along said lower surface, and a second electrode formed via a dielectric film on a surface of said first electrode. Said first electrode may contain an electric conductive material of either Al metal or Al alloy containing at least one kind of atom among Si, Ti and Cu. Also, said dielectric film can be Al$_2$O$_3$. Between said dielectric film and said at least one of both electrodes can be comprised a dielectric layer.

The above construction of the present invention can be manufactured with a method including a process of forming a first electrode having an upper layer portion and a lower layer portion in which said lower layer portion is formed by depositing selectively conductive material on a lower surface within an opening where the lower surface is exposed formed in an insulation film on the conductive lower surface and then said upper layer portion is formed by depositing selectively conductive material in a direction from an upper portion of said lower layer portion along said lower surface, and a process of exposing a lower face of said upper layer portion and a surface of said lower layer portion by removing a portion of said insulation film which is located under said upper layer portion of said first electrode and surrounding said lower layer portion, a process of forming a dielectric film on the exposed surface of said first electrode, and a process of forming a second electrode composed of conductive material on said dielectric film.

Hereby, the process of forming said first electrode can be accomplished with the CVD method using a gas of alkyl aluminum hydride and hydrogen. In this case, said alkyl aluminum hydride may be dimethyl aluminum hydride. Moreover, said dielectric film may be an aluminum oxide film. A process of forming a dielectric layer on said dielectric film can be further included.

In the present invention, since the first electrode has a lower layer portion on conductive lower surface and an upper layer portion extending out in a direction from the lower layer portion along the lower surface, it is possible to increase the surface area and capacity of whole capacitive element by making a projected plane area of the upper layer portion to the lower surface larger than that of the lower layer portion. As described above, as the first electrode has a double layer structure, it is possible to greatly increase the degree of integration by making the effective use of a space on the lower surface located beneath an overhung portion of the upper layer portion as the space for other elements.

Also, in the present invention, as the first electrode is formed with a metal deposition technique using a new CVD method, it is possible to form an upper layer portion extending out in a direction along a lower surface by growing crystal of lower layer portion with a facet depending on the face orientations of lower layer portion and lower surface from an upper face of lower layer portion formed by depositing selectively conductive material on the lower surface within an opening.

BRIEF DESCRIPTION OF THE DRAWINGS

FIG. 12 is a typical cross-sectional view showing a capacitor according to one example of the present invention.

FIG. 13 is a typical cross-sectional view showing a capacitor according to one example of the present invention.

FIG. 14 is a circuit diagram showing a DRAM according to one example of the present invention.

FIG. 15 is a circuit diagram showing an optical sensor according to one example of the present invention.

DETAILED DESCRIPTION OF THE PREFERRED EMBODIMENTS

Figure 1:
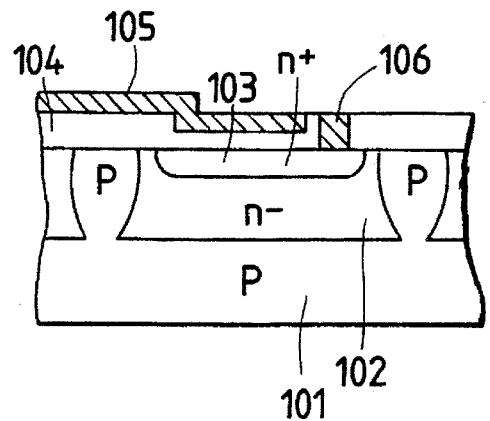
FIG. 1 is a typical cross-sectional view of a conventional MOS capacitor.
Figure 2:
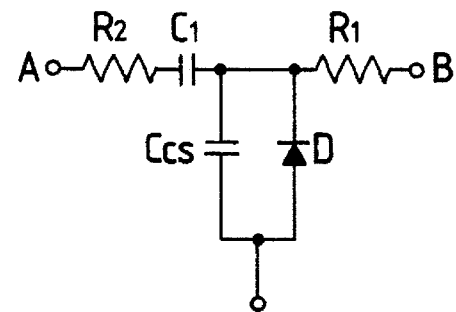
FIG. 2 is an equivalent circuit diagram of the capacitor as shown in FIG. 1.
Figure 3:
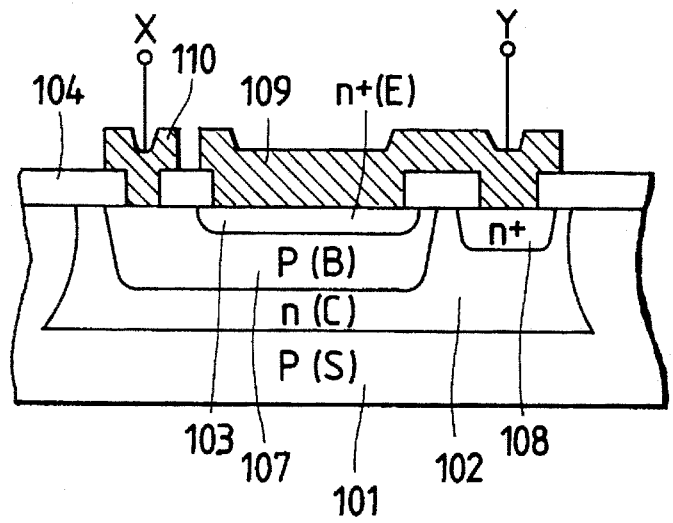
FIG. 3 is a typical cross-sectional view of a conventional pn junction capacitor.
Figure 4:
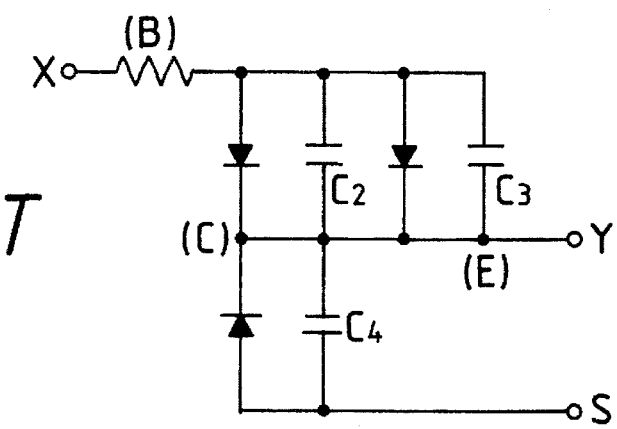
FIG. 4 is an equivalent circuit diagram of the capacitor as shown in FIG. 3.
Figure 5:
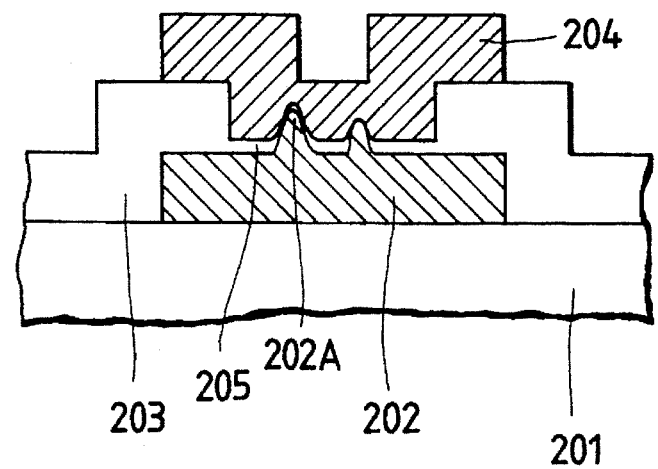
FIG. 5 is a typical cross-sectional view of a conventional capacitor of another type.

An example of the present invention will now be described with reference to the drawings, but the present invention is not limited to these examples, a combination of essential techniques in each example or various changes of design can be made.

EXAMPLE 1

An example 1 of the present invention will be described below in detail with reference to the drawings.

FIG. 12 is a typical cross-sectional view showing a preferred embodiment of the present invention.

A capacitor is constructed such that a predetermined region of an insulation layer 2 formed on the surface of a semiconductor substrate 1 is removed, and on a specified region of the semiconductor substrate is formed a metal layer 3 as a lower electrode, on the surface of which a first dielectric film 4 is formed, and further via a second dielectric layer 5, a second metal layer 6 is provided as an upper electrode.

The surface of lower electrode metal layer according to the present invention is a quite flat surface, on which a quite thin dielectric is formed. Such a metal layer can be formed with a new CVD method as will be described. At least one of the electrodes is Al or a metal with the base of Al such as Al—Si, Al—Ti, Al—Cu, Al—Si—Ti or Al—Si—Cu. Particularly, monocrystal Al is more preferable. A lower semiconductor region can be either of n-type and p-type, and a film made of barrier metal such as TiN can be interposed, but with new CVD method (referred to as Al-CVD method) as will be described later, the barrier metal is not necessarily required because the quality of film to be deposited is quite excellent.

And as its surface property is also excellent, the dielectric film formed on the surface can be made thin and the capacity can be increased. The dielectric film can be fabricated as a thinner and finer film, with the oxidation of electrode, so that it is possible to further increase the capacitance of capacitor.

The second dielectric layer can be made of any one of oxide or nitride with high dielectric constant. Furthermore, an electrostatic capacitive element can be constituted using a single dielectric by omitting the second dielectric layer.

Also, a multilayer interconnection can be formed in such a way as to form an interlayer insulation film on a metal layer of upper electrode, provide an opening reaching the upper electrode, and deposit a metal in its opening for connection with an interconnection pattern provided on the interlayer insulation film.

A semiconductor device having a capacitive element with a structure as shown in FIG. 12 was made.

On a face (100) of exposed Si monocrystal substrate 1, Al was selectively deposited with the CVD method using DMAH (dimethyl aluminum hydride) and hydrogen. The temperature of base substance was 290° C. At this time, Al monocrystal with a face orientation (111) was grown. Its surface was quite flat. With RIE (reactive ion etching) method, Al monocrystal was processed into a desired shape, and a SiO$_2$ film 2 was deposited in a thickness of 8,000 Å, with the CVD method. Then, an opening portion was provided at a place corresponding to a capacitive portion on the Al monocrystal by etching the SiO$_2$ film with the photoresist patterning and RIE. Next, by dipping the whole of water into a solution of H$_2$O$_2$:H$_2$O=1:1, a Al$_2$O$_3$ film 4 with a thickness of about 15 Å was formed on exposed surface of Al monocrystal 3. It should be noted that in the above procedure, it is also possible to firstly form the SiO$_2$ film 2 on the Si substrate 1, provide an opening portion reaching the surface of Si substrate 1 at a predetermined place, selectively deposit Al on an exposed surface of the Si substrate 1, and form the Al$_2$O$_3$ film 3 on its surface. Next, the substrate was heated to about 350° C., and a silicon nitride film 5 was deposited in a thickness of about 100 Å, with the CVD method using NH$_3$ gas and SiH$_4$ gas. Furthermore, with ordinary CVD method, an upper layer Al was deposited on the silicon nitride film 5 and the SiO$_2$ film 2, and an upper electrode 6 was formed with the patterning. The upper layer Al film is not necessarily made with the CVD method, but the CVD method is more preferable than the deposition with high energy such as the sputtering, because thin dielectric film is less damaged. It is also possible to form the Al$_2$O$_3$ film in a desired thickness and omit the formation of silicon nitride film.

The manufacturing yield and presence and absence of hillocks of an electrostatic capacitive element made in the above way according to the present invention is shown in Table 1, as compared with the electrostatic capacitive element formed with a lower electrode Al using a conventional magnetron sputtering method (substrate temperature 250° C., Ar pressure 6 mTorr). As the parameter, the alloy processing temperature after formation of upper Al electrode is taken, in which values for 20 manufacturing examples are shown in Table.

TABLE 1

|  | Alloy processing | Yield (%) | Hillock |
|---|---|---|---|
| Present invention | None | 100 | Not seen |
|  | 400° C., 30 Min. | 100 | Same as above |
|  | 450° C., 30 Min. | 95 | Same as above |
| Conventional method | None | 75 | Exists |
|  | 400° C., 30 Min. | 30 | Many exists |
|  | 450° C., 30 Min. | 20 | Same as above |

As shown in Table 1, according to the present invention, the electrostatic capacitive element can be fabricated without hillocks on the surface of Al electrode and at high yield. Furthermore, according to the present invention, as the quite thin dielectric film can be formed because of its flat surface of Al electrode, a semiconductor device including an electrostatic capacitive element in small-size and with large capacity can be realized. A conventional DRAM was formed in a polycrystal Si—SiO$_2$/Si$_3$N$_4$/SiO$_2$-polycrystal Si structure, with a thickness of insulation layer of about 100 Å in terms of SiO$_2$. As the dielectric constants of SiO$_2$ and Al$_2$O$_3$ are 3.9 and 10.0, respectively, the area to be occupied by accumulation capacity with same thickness can be reduced up to about 40% that of conventional one, according to the present invention, so that it is possible to decrease the dimension of chip greatly.

EXAMPLE 2

FIG. 13 shows another structure of an electrostatic capacitive element according to a second example of the present invention. This example comprises a first Al electrode 12 deposited on a semiconductor substrate 11, with the CVD method using DMAH and hydrogen as previously described, a dielectric layer 13, a second Al electrode 14 deposited unselectively with sputtering method, a dielectric layer 15, a third Al electrode 16 deposited unselectively with sputtering method, an insulation layer 17 and interlayer insulation film 18, wherein a first electrostatic capacitive element is formed of the first electrode 12, the dielectric layer 13 and the second electrode 14, and a second dielectric layer is formed of the second electrode 14, the dielectric layer 15 and the third electrode 16. The dielectric layers 13 and 15 can be single layers of Al$_2$O$_3$, or complex layers with other dielectric layer of silicon nitride, for example.

In this way, as two capacitive elements can be formed by lamination on the semiconductor substrate, the area of chip can be reduced. Furthermore, if the first electrode 12 and the third electrode 16 are connected, it is possible to obtain larger capacity with the same area, with the parallel connection of the capacity between first electrode 12 and second electrode 14 and that between second electrode 14 and third electrode 16. Also, the capacity can be further increased by increasing the number of laminations in the capacitive element. Furthermore, by forming the first electrode 12 on an upper electrode of MOS capacitor as shown in FIG. 1, and connecting it in parallel to a lower MOS capacitor, larger capacity can be provided.

According to the present invention, as the accumulation capacity can be increased with the same area, the transfer efficiency in reading can be made closer to 1.0, for example, if the capacitor is applied to a sample-and-hold circuit. Also, in a sensor using the sample-and-hold circuit, the sensitivity of sensor can be improved.

EXAMPLE 3

FIG. 14 shows an equivalent circuit of a semiconductor device according to the present invention. This device is an example of DRAM storage cell, wherein nMOS transistor 521 for read/write and an electrostatic capacitive element 522 for accumulation of electric charges with a structure as shown in FIG. 12 or 13 are formed on a semiconductor substrate, and further, a bit line 523 and a word line 524 are wired.

To improve the degree of integration for DRAM, it is necessary to secure a capacitance of 10 pF with small area, and form a reliable charge accumulation element of dielectric layer in the capacitive portion. As previously described, according to the present invention, the capacitive element satisfying such a condition can be implemented so that the degree of integration in DRAM can be improved.

EXAMPLE 4

FIG. 15 shows an exemplary circuit diagram of a photoelectric transfer element of the type in which carriers are accumulated in a base region as the control electrode region and a signal is read with an emitter follower circuit, to which the present invention is applicable. This example comprises an npn-type phototransistor 531, a capacitor 532 added onto a control electrode as required, a reset pMOS transistor 533 for clamping base potential, an emitter reset nMOS transistor 534 for extinguishing carriers accumulated by connecting an emitter to a predetermined reference voltage and forward biasing the base emitter, read nMOS transistors 535 and 537, an accumulation capacitor 536 and a load capacitor 538 with the structure as shown in FIG. 12 or 13, which are formed on a semiconductor substrate. This basic structure is disclosed in European Laid-Open Patent Application No. 0132076 and a corresponding U.S. Pat. No. 4,791,469.

The area of the accumulation capacitor 536 may normally occupy 10 to 25% that of a monocrystal semiconductor substrate on which the photoelectric transfer element is formed. Accordingly, by applying the present invention, the accumulation capacitor can be made smaller, so that the area of photoelectric transfer element chip can be reduced by 5 to 20% as compared with conventional one.

EXAMPLE 5

Figure 16:
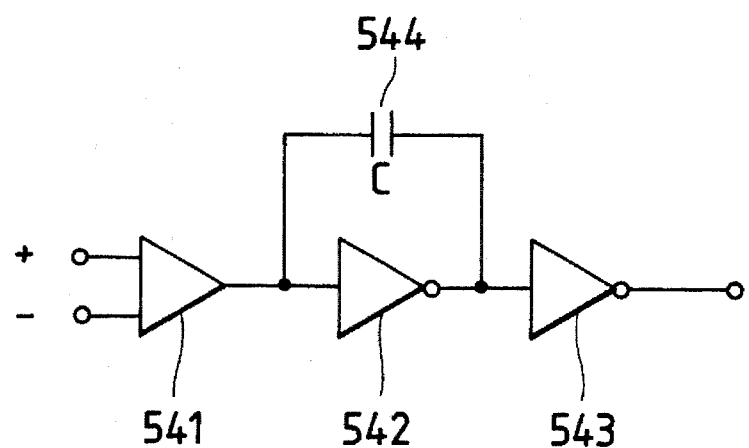
FIG. 16 is a circuit diagram showing an operational amplifier according to one example of the present invention.

FIG. 16 shows an exemplary circuit diagram of an operational amplifier to which the present invention is applicable. This operational amplifier comprises an input amplifier 541, an amplifying stage amplifier 542, an output stage amplifier 543 and a phase compensating capacitor 544 with the structure as shown in FIG. 12 or 13, which are formed on the same semiconductor substrate.

In general, in the operational amplifier, the phase compensating capacitor 544 is added between input and output of amplifying stage where input and output are in reversed relation. A major purpose of the phase compensating capacitor is to stabilize the operation of circuit by biasing the frequency component more than or equal to that in the frequency characteristics of amplifying stage. However, as previously described, when a capacitor having bad frequency characteristics with conventional technique is used, the effects of phase compensating capacitor can not be sufficiently obtained. On the contrary, according to the present invention, a capacitor having excellent frequency characteristics can be used, so that the effects of phase compensating can be sufficiently exhibited, and the operation of circuit can be made stable.

EXAMPLE 6

Figure 17:
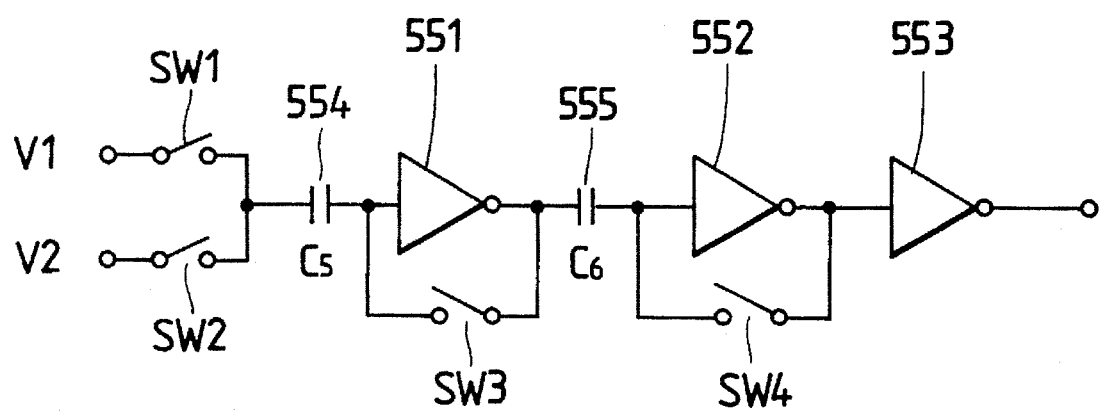
FIG. 17 is a circuit diagram showing a comparator circuit according to one example of the present invention.

FIG. 17 shows an example of a comparator circuit to which the present invention is applicable. A comparator of this example comprises amplifiers 551, 552 and 553, capacitors 554 and 555 with the structure as shown in FIG. 12 or 13, and switches SW1–SW4.

First, the operation of the comparator will be outlined. In a state in which switches SW1, SW3, SW4 are ON, and SW2 is OFF, the capacitor 554 is charged with the input voltage $V_1$ and the offset voltage of amplifier 551, and the capacitor 555 is charged with the output voltage of amplifier 551 and the offset voltage of amplifier 552. Next, switches SW1, SW3, SW4 are turned OFF, and SW2 is turned ON, and then the voltage $V_1$ used for charging and the input voltage $V_2$ are compared.

Hereby, the capacitor 555 and the amplifiers 552, 553 are used to increase the gain of comparator, with the dimensions being determined depending on the needed gain.

With conventional MOS capacitors, as previously described, there was a disadvantage that in forming the capacitors 554, 555, parasitic capacitances would be likely to occur on the input side of amplifier, to turn OFF switches SW3 and SW4, and place the capacitors in high impedance state on one sides thereof, which might cause the capacitance division due to the capacitors 554, 555 and parasitic capacitance of each capacitor, and increase the offset voltage of comparator.

Furthermore, with conventional capacitors, there was a disadvantage that the charge speed might be restricted owing to parasitic resistance existing in series with capacitor. On the contrary, according to the present invention, as parasitic capacitance and parasitic resistance can be reduced significantly, it is possible to fabricate the comparator with smaller offset and faster speed that conventional one.

As above described, in the first to sixth examples of the present invention, with new CVD method, it is possible to fabricate the electrodes of electrostatic capacitive element by selectively depositing a metal with the surface being quite flat, e.g. Al, on a semiconductor substrate.

As $Al_2O_3$ as dielectric layer is formed on monocrystal Al, it becomes quite fine film. Accordingly, capacitive elements with few pinholes and excellent withstand voltage distribution can be formed. Furthermore, according to the present invention, since a plurality of capacitors can be formed on a semiconductor element, the semiconductor integrated circuit can be made at higher density.

Moreover, according to the present invention, it is possible to improve the characteristics of various semiconductor devices by enhancing the transfer efficiency of photoelectric transfer element or improving the frequency characteristics of comparator circuit.

EXAMPLE 7

A preferred embodiment of the present invention will be described below.

Figure 18A:
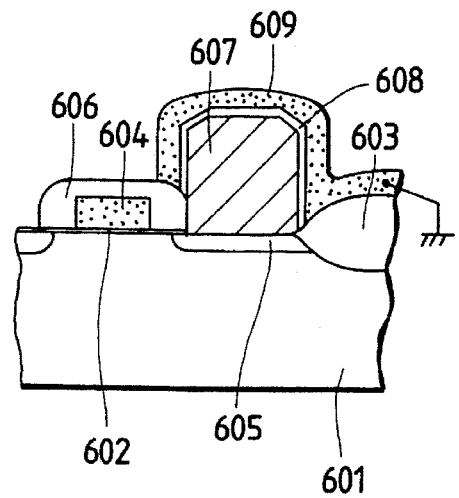
FIGS. 18A and 18B are typical views for explaining a semiconductor memory according to one example of the present invention.

FIG. 18A is a typical cross-sectional view of a portion of semiconductor device according to an example 7 of the present invention.

On the principal plane of a semiconductor substrate 601 is formed a gate insulation film 602, on the periphery of which is formed a thick field insulation film 603 so as to delineate a region of semiconductor element. Within the region of semiconductor element, there are formed drain and source region 605, between which a gate electrode 604 is provided via a gate insulation film 602. A capacitor is constituted such that a lower layer electrode 607 is provided on a surface of semiconductor region exposed through an opening formed in the insulation films on the surface of semiconductor region, such as insulation film 606 of gate electrode and field insulation film 603, and an upper electrode is provided via a dielectric film 608 thereon.

Figure 18B:
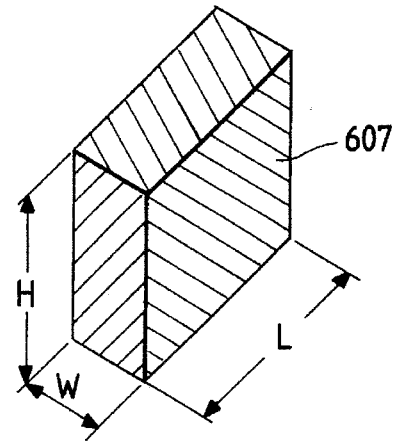

Hereby, the most characteristic feature of constitution is that the lower layer electrode 607 is made in a longitudinal structure as shown in FIG. 18B. With such structure, the capacitance can be increased while the area occupied by the capacitor along the surface of semiconductor substrate is left small.

The longitudinal structure is of such a shape that the length in a direction crossing a junction surface with semiconductor region thereunder is longer, including shapes such as circular cylinder, prism, circular cone, pyramid, etc. Preferably, a rectangular parallelopiped shape is favorable because it is easily designed. With the rectangular parallelopiped shape, assuming the length of short side of junction surface with the under semiconductor region to be W, the height H is designed so as to satisfy the relation H>W.

Here, a ratio of H to W and a long side L ($\geq$W) of junction surface are appropriately selected in accordance with the capacitance of capacitor to be designed, and the area occupied by the capacitor can be reduced if magnitude relation between H and W only satisfies the above expression.

With conventional techniques, it was still difficult to bury contact holes having large aspect ratio with electrical conductive material completely, for example.

Therefore, because contact portions could not be made longitudinal, it could be never conceived that one electrode of the capacitor was constructed to satisfy the above relation.

The present invention was made on the discovery that good quality of metal can be deposited on very excellent selectivity by using new CVD method as will be described later.

As a result of more detailed study and examination, the conception could be changed because it was found that its growth would extend in a longitudinal direction.

The structure of capacitor electrode according to the present invention is rectangular parallelopiped, but includes one having tapered edge portion as shown in FIG. 18A.

As this electrode, Al or a metal with the base of Al such as Al—Si, Al—Ti, Al—Cu, Al—Si—Ti or Al—Si—Cu is preferable, and W, Mo or Cu can be used. Particularly, monocrystal Al is more preferable.

Also, the under semiconductor region is any of n-type and p-type, and a film made of barrier metal such as TiN can be interposed, but with the new CVD method as will be described later, barrier metal is not required because the quality of film to be deposited is quite excellent.

And the dielectric film can be fabricated thin with large capacity because its surface property is also excellent. The dielectric film can be made thinner and finer if it is obtained with the oxidation of electrode, so that the capacitance of capacitor can be further increased.

The CVD method preferably used in electrode type of the present invention will be described. In the following explanation, an instance will be cited in which the contact between semiconductor element and upper interconnection is excellent and the flat upper interconnection is formed. Its aim is to show how well in selectivity good quality of film can be made in the longitudinal shape, wherein the burying within contact hole having large aspect ratio is mainly achieved to form the above-described electrode, because the film deposited on the insulation film having contact hole is excellent in selectivity.

With a method as will be described below, it will be understood that the multilayer interconnection can be made via the insulation film on the constitution as shown in FIG. 18A.

EXAMPLE 8

Figure 6:
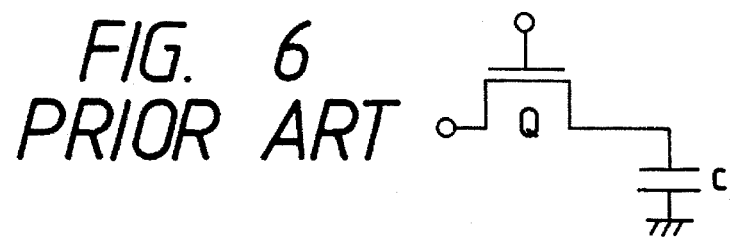
FIG. 6 is a circuit diagram of a conventional memory cell.
Figure 7:
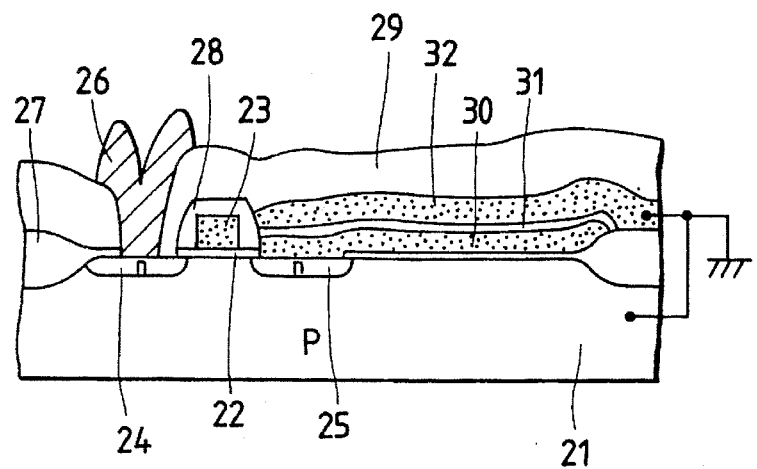
FIGS. 7 to 9 are typical cross-sectional views of conventional semiconductor memory cells, respectively.
Figure 8:
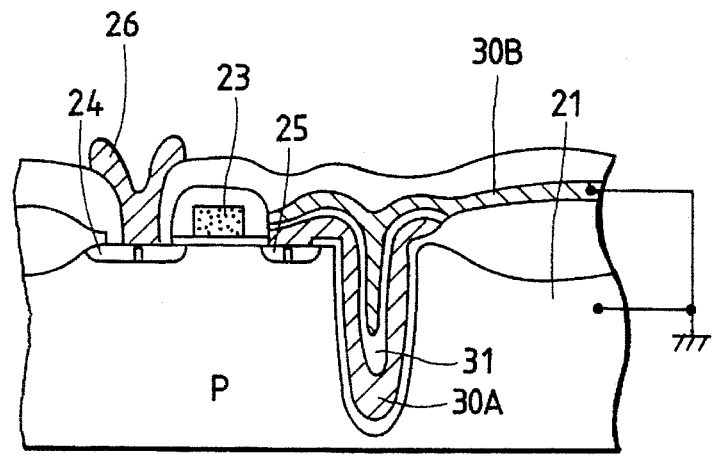
Figure 9:
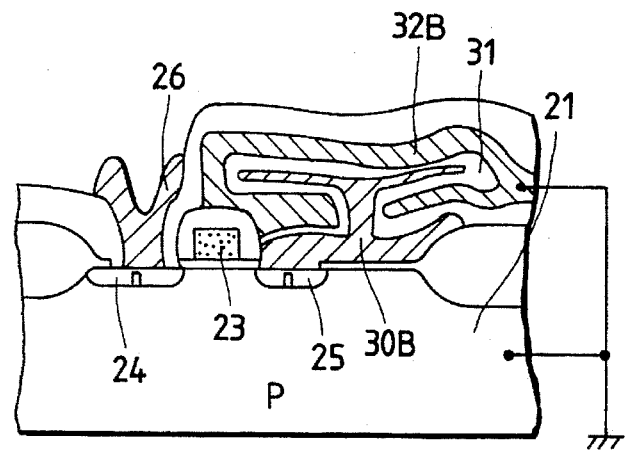
Figure 10:
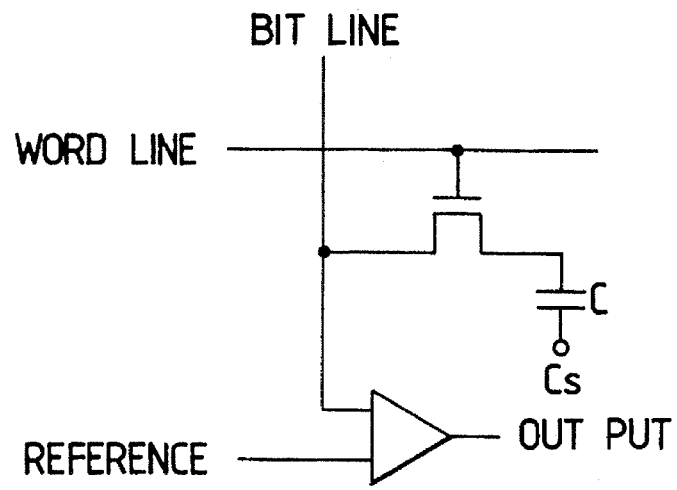
FIG. 10 is an equivalanet circuit diagram of the conventional memory cell.
Figure 11:
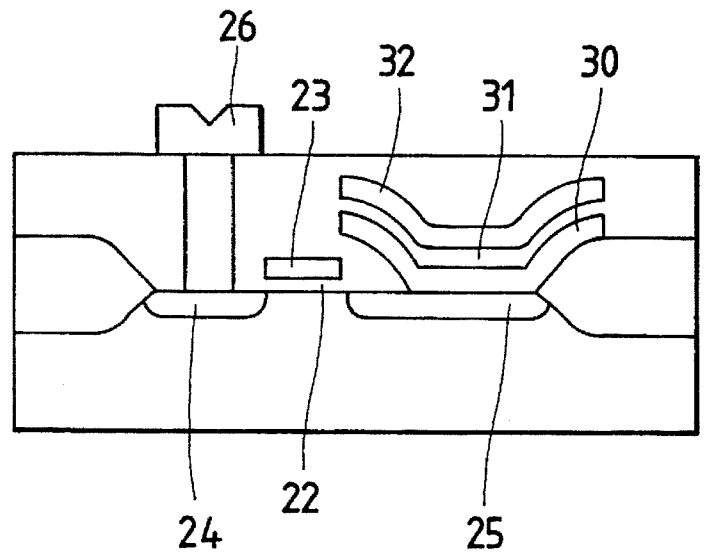
FIG. 11 is a typical cross-sectional view of another conventional semiconductor memory.
Figure 19:
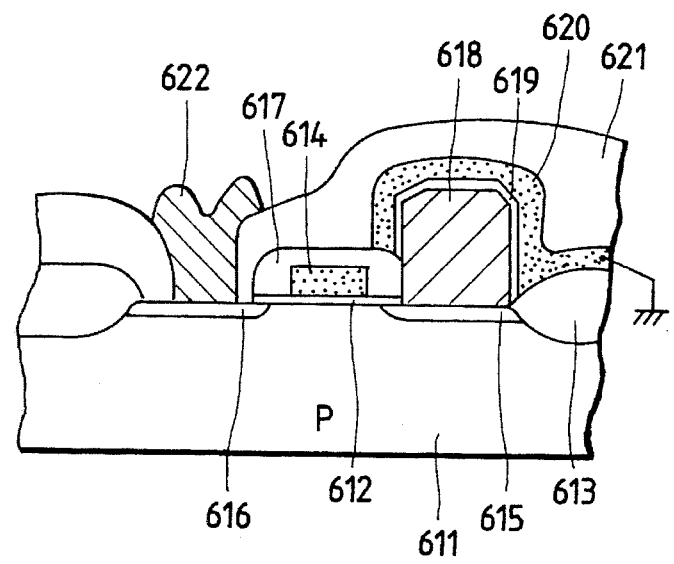
FIG. 19 is a typical cross-sectional view of a semiconductor memory according to one example of the present invention.

FIG. 19 is a typical cross-sectional view of a memory cell according to an example 8 of the present invention. The circuit structure of the memory cell as shown in FIG. 19 corresponds to a circuit as shown in FIG. 6. On the surface of a p-type substrate 611 are formed a gate oxide film 612 and a field oxide film 613, a polysilicon gate 614, an n-type drain region 615, and a source region 616 are provided, the polysilicon gate 614 being covered with an oxide film 617. On oxide film on the upper side of the drain region 615 is opened a contact hole, in which Al monocrystal 618 is deposited on the drain, with the selective deposition method as above described, to thereby constitute a capacitor together with an oxide film ($Al_2O_3$) 619 and polysilicon 620. An upper portion of the source region 616 of interlayer insulation film 621 is opened, in which Al electrode is provided. It is preferable that the Al electrode is also formed with the selective deposition method. Using the Al-CVD method, it is possible to flatten the interconnection without forming irregularities on its surface as shown. It is also possible to open a through hole on the polysilicon gate 614, fill its inside with Al, with the selective deposition method, and form the Al interconnection on the interlayer insulation film, with the non-selective deposition, to connect with polysilicon gate.

A manufacturing method according to the present invention will be now described with reference to FIGS. 20A to 20H.

Figure 20A:
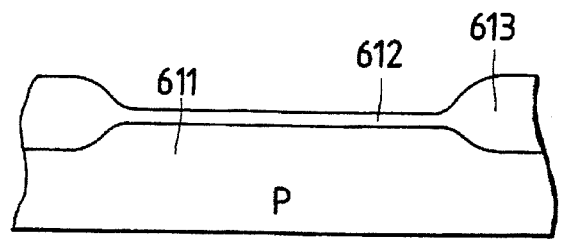
FIG. 20A to 20H are typical views for explaining a process of manufacturing a semiconductor memory according to one example of the present invention.
Figure 20B:
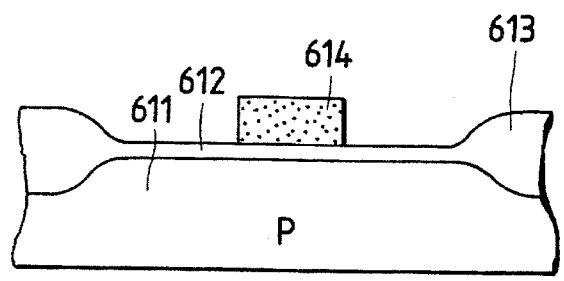
Figure 20C:
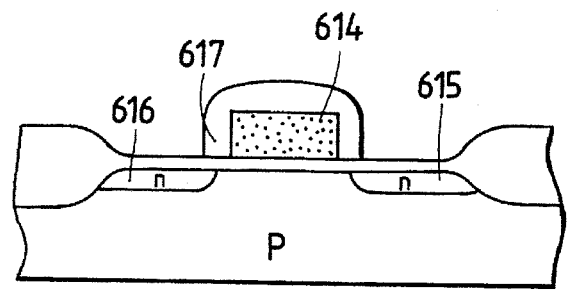
Figure 20D:
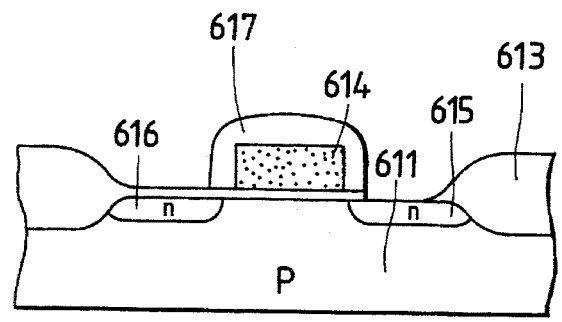
Figure 20E:
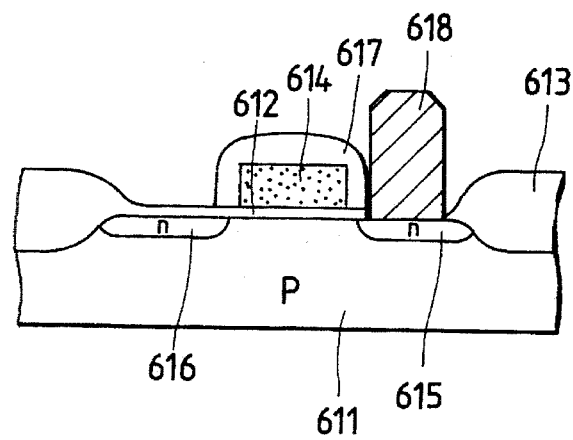
Figure 20F:
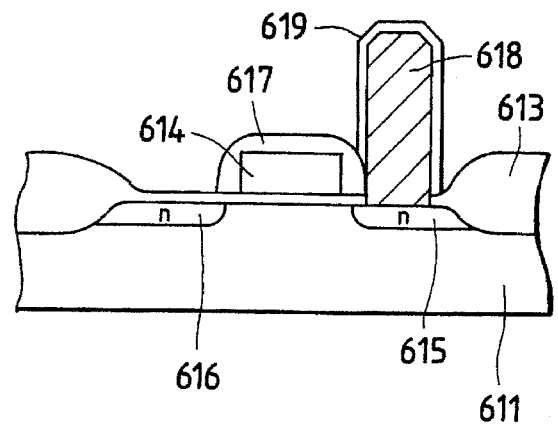
Figure 20G:
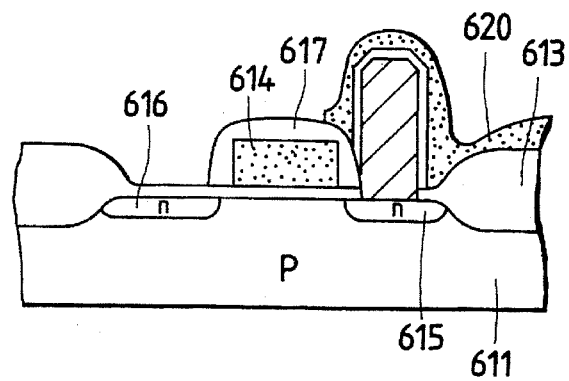
Figure 20H:
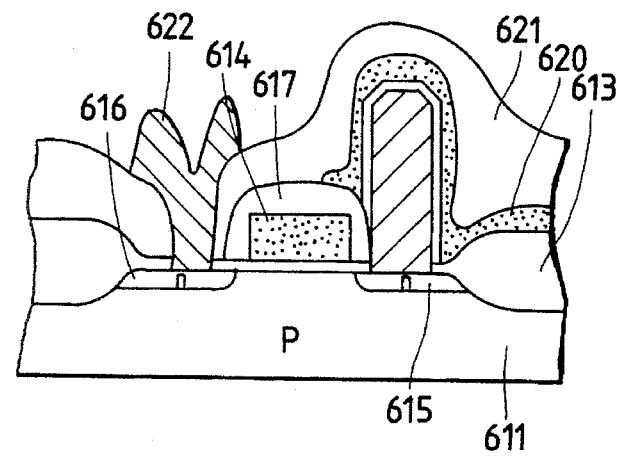

First, as shown in FIG. 20A, a gate oxide film 612 and a field oxide film 613 are formed on a p-type substrate 611. Next, polysilicon is deposited with the CVD method, and a polysilicon gate 614 is formed with the patterning (FIG. 20B). An nMOS structure is constructed in such a manner that with the ion injection method, an n-type drain 615 and a source 616 are formed, and an oxide film 617 is formed on the surface of polysilicon gate 615 (FIG. 20C). These processes are the same as those of conventional one. A contact hole is formed by removing an oxide film 612 on upper portion of the drain 615 (FIG. 20D). Afterwards, with the CVD method using Al $(CH_3)_2H$ and $H_2$, Al 618 having a thickness of 1 μm is selectively deposited on the drain (FIG. 20E). This deposition is performed in self-coordinated manner, in which Al deposited is monocrystal, with its upper and lateral sides being quite flat. Next, an $Al_2O_3$ film 619 is formed by oxidizing thermally or anodizing the surface of Al monocrystal 618 (FIG. 20F). This oxide film 619 becomes thin and quite fine because it is formed by oxidization of monocrystal Al. The anodized film becomes especially fine. Next, a polysilicon layer 620 is formed with the CVD method, and made opposite electrodes for capacitor (FIG. 20G). Afterwards, an interlayer insulation film 621 is formed, a contact hole is opened on the source, and Al is deposited as a source electrode 622 with the sputtering (FIG. 20H).

The capacitor of memory cell made in this way has small area, with its element surface area being less than or equal to that of the drain region, and so is suitable for higher integration, wherein the area of capacitor, i.e., the entire area of oxide film including the side face of Al monocrystal is sufficiently large, and the oxide film is thin and fine, and further, the dielectric constant of $Al_2O_3$ is at high value, that is, about 2.5 times that of $SiO_2$, whereby the capacitor with large capacity can be constituted. It should be noted that the present invention is also applicable to PMOSFET, and further, the capacitor is constituted on the source side but not on the drain side.

EXAMPLE 9

Figure 21:
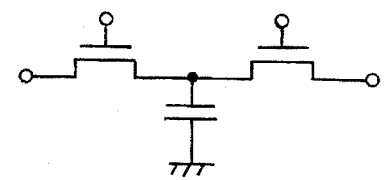
FIG. 21 is a typical circuit diagram of a semiconductor circuit device according to one example of the present invention.
Figure 22:
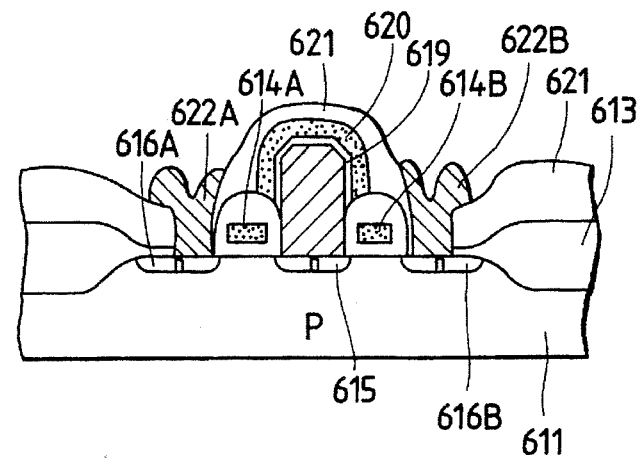
FIG. 22 is a typical cross-sectional view of a semiconductor circuit device according to one example of the present invention.
Figure 23:
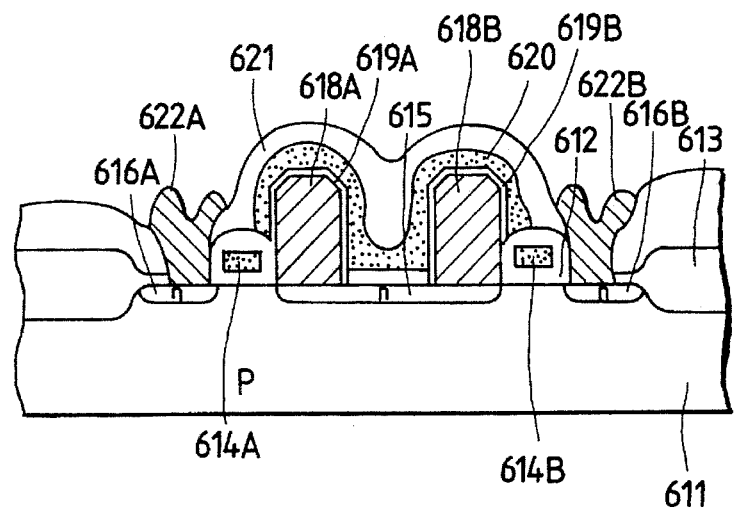
FIG. 23 is a typical cross-sectional view of a semiconductor circuit device according to one example of the present invention.

FIG. 21 shows another circuit to which the present invention is applicable. This circuit is used as a sample-and-hold circuit or switched capacitor circuit, with a capacitor being connected to a drain region common to two MOSFET. FIGS. 22 and 23 are typical cross-sectional views showing a device structure for implementing the circuit as shown in FIG. 21. A device as shown in FIG. 22 shares a drain 615, in which the capacitor is constituted such that Al monocrystal 618 is deposited, in self-coordinated manner, on the drain of two nMOSFET having polysilicon gates 614A, 614B, sources 616A, 616B and source electrodes 622A, 622B, using the selective growth method, in the same way as in FIG. 19. A device of FIG. 23 has a further increased capacitance by constituting a capacitor in such a way that two contact holes are formed by removing two places of oxide film on the drain 615, Al monocrystals 618A, 618B are deposited in self-coordinated manner on two places of the drain, with the selective growth method, $Al_2O_3$ films 619A, 619B are formed by oxidizing its surface, and then a polysilicon 620 is formed with the CVD method. Each device as shown in FIGS. 22 and 23 has capacitor with large capacity and small element surface area, whereby the same effects as those in the example 7 can be provided.

It should be noted that the present invention is not limited to the above circuit, but is applicable to semiconductor devices incorporating capacitors as shown in the examples 3-6. That is, a capacitor can be constituted by selectively depositing Al in self-coordinated manner at a desired position on the semiconductor substrate, as required in the circuit design, and oxidizing its surface.

As above described, according to the examples 7-9 of the present invention, it is possible to reduce the dimension of device while increasing the capacitance of capacitor, and thus, to provide higher integration and faster operation speed of a semiconductor device. Furthermore, according to the present invention, the semiconductor device manufacturing process can be simplified.

EXAMPLE 10

An example of the present invention will be now described with reference to the drawings.

Figure 24:
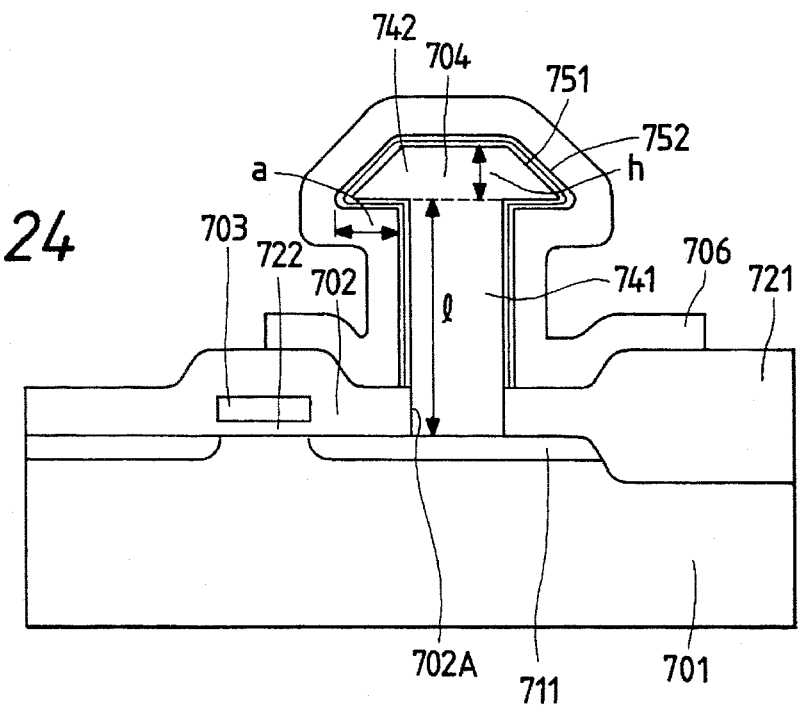
FIG. 24 is a typical view for explaining a semiconductor memory according to one example of the present invention.

FIG. 24 is a typical cross-sectional view showing an example of a semiconductor device according to the present invention. On the surface of a semiconductor substrate 701 with a face orientation (100) as an electrical conductive surface, an interlayer insulation film 702 such as $SiO_2$ is formed. This insulation film 702 has an element separation region 721 formed therein. On the surface of semiconductor substrate 701 at a position off the element separation region 721 is formed a gate oxide film 22 for formation of MOS transistor, on which a polysilicon electrode 703 is formed.

Between the element separation region 721 of this insulation film 702 and the polysilicon electrode 703 is formed an opening 702A through which an n-type layer 711 on a surface of semiconductor substrate 701 is exposed. Within this opening 702A and on an upper portion of the opening 702A, a metal layer 704 is formed as a first electrode projecting from the surface of insulation film 702. This metal layer 704 is constituted of a substantially cylindrical lower layer portion 741 having a height 1 from the surface of semiconductor substrate 701 within the opening 702A, and a truncated cone upper layer portion 742 positioned over an upper surface of this lower layer portion 741 and having a bottom portion with a length a in a direction from a side of lower layer portion 741 along the surface of semiconductor substrate 701, and a height h from the upper surface of lower layer portion 741. This metal layer 704 is an Al monocrystal with a face orientation (111), and is desirably formed using new CVD method as will be described later. With this CVD method, it is possible to control suitably the height 1 of lower layer portion 741 and the length a and height h of bottom portion of upper layer portion 742 for the metal layer 704. The lower layer portion 741 grows with a facet (face orientation (111)) depending on the face orientation (100) of semiconductor substrate 701, while the upper layer portion 742 grows with a facet depending on the face orientation of lower layer portion 741 in addition to the face orientation of semiconductor substrate 1. In this way, if Al (111) crystal is grown using Si (100) substrate, the upper surface becomes flat, and suitable for integration. In order to increase the surface area of metal layer 704, it is sufficient to increase the length a by growing the bottom portion, taking into consideration the mechanical strength of bottom portion of upper layer portion 742 and the positional interrelation with other elements. FIG. 24 shows the constitution of Al electrode 741 by removing the insulation layer which determines 1 and h for clearness. The electrode material which can be used for the metal layer 704 is preferably Al or Al alloy with the base of Al such as Al—Si, Al—Ti, Al—Cu, Al—Si—Cu or Al—Si—Ti. Particularly, monocrystal Al is more preferable because of its excellent surface property.

The surface of metal layer 704 with excellent surface property is formed with a dielectric film 751 such as $Al_2O_3$ and a dielectric layer 752 such as $Ta_2O_5$ on a portion exposed from the insulation layer 702, which are laminated in order. On the dielectric film 751 and dielectric layer 752 and the insulation layer 702, a metal layer 706 as the second electrode is formed in a predetermined thickness of film. The first and second electrodes 704 and 706, together with the dielectric film 751 and dielectric layer 752, constitute the capacitive element.

The above metal layer 704 is excellent in surface property at any portion, so that the dielectric film formed on the surface can be made thin, and the capacity of dielectric film can be increased because of its large surface area. The dielectric film is more preferably obtained by oxidizing the electrode. If the formation material of metal layer is Al, for example, the dielectric layer obtained by oxidization of it is $Al_2O_3$, and as it has a dielectric constant of 10.0, which is larger than $SiO_2$, the capacity of dielectric layer can be further increased.

Also, as the dielectric layer, $Ta_2O_5$ film with a dielectric constant of 722 is deposited, for example, the capacity can be further increased.

Figure 25:
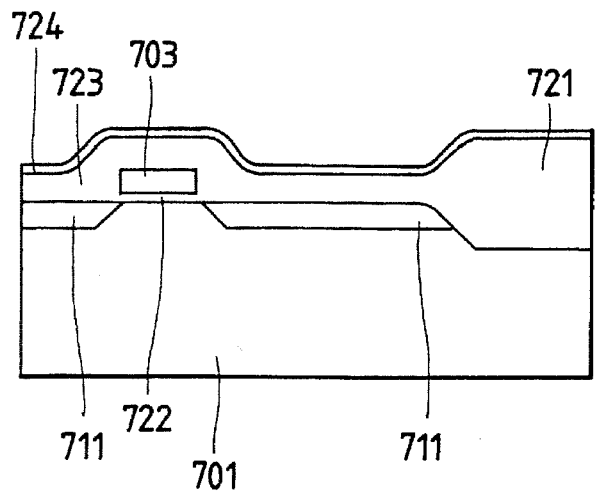
FIGS. 25, 26 and 27 are typical views for explaining processes of manufacturing semiconductor memories according to examples of the present invention.

Next, an example of method for manufacturing a semiconductor device according to the present invention as shown in FIG. 24 will be described with reference to FIGS. 25 to 27.

The $SiO_2$ and $Si_3N_4$ films are bonded on the surface of p-type semiconductor substrate 701 with a face orientation (100), and the $Si_3N_4$ film is only left on a portion where the formation of transistor with photoetching is expected. Furthermore, B is introduced by ion implantation with a photoresist film as mask, and then the element separation region 721 is formed on a portion of semiconductor substrate 701 where there is $Si_3N_4$ film by wet oxidation. Next, after removing $Si_3N_4$ and $SiO_2$ films, a gate oxide film 722 is formed by dry oxidation and HCl oxidation. After B is introduced into the gate oxide film 722 by ion implantation, a polysilicon electrode 703 is deposited by thermal decomposition of $SiH_4$. Then, with dry etching using photoetching and $CF_4$ gas, the polysilicon electrode 703 is processed. Next, with the polysilicon electrode 703 as mask, As is introduced by ion implantation, and then $SiO_2$ film (PSG) containing P, n-type layer 711 and $Si_3N_4$ film 724 are formed as interlayer insulation film 723, with the CVD method (see FIG. 25).

Figure 26:
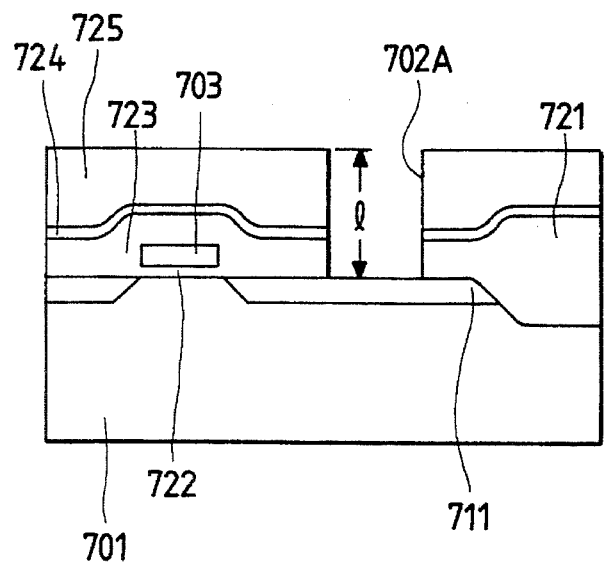

Then, after the $SiO_2$ film 725 is deposited on the $Si_3N_4$ film 724 with the CVD method, with resist patterning and reactive ion etching (RIE), an opening 702A is formed so as to expose the surface of n-type layer 711 (see FIG. 26).

Next, an electrical conductive material such as Al is selectively deposited from the surface of n-type layer 711 within the opening 702A, with new CVD method as will be described later. The partial pressure of Al source gas and the temperature of substrate are increased at a position where an upper surface of Al film exceeds an upper edge of opening 702A, so that a metal layer 704 is formed by deposition in a direction along the surface of semiconductor substrate 701 (see FIG. 27).

Then, the metal layer 704 is exposed by selectively removing the $SiO_2$ film 725 positioned under a bottom portion of upper layer portion 742 of metal layer 704 and near the side of lower layer portion 741.

Next, a dielectric film 751 such as $Al_2O_3$ is formed on the surface of metal layer 704 by oxidation. The oxidation method may be lamp anneal. Then, a dielectric layer 752 such as $Si_3N_4$ is deposited, with the CVD method under reduced pressure using $NH_3$ gas and $SiH_4$ gas, after heating the substrate 701 to a predetermined temperature. Next, with ordinary CVD method having excellent coating property, Al for example is deposited on the dielectric layer 752, and a metal layer 706 is formed with the patterning. This metal layer 706 can be made of polysilicon with the bias sputtering which permits deposition at low temperature.

Next, on the base substance where Al has been selectively deposited as above described, Al is unselectively deposited with the sputtering method as described above so as to make the patterning.

As a result, the Al film with the sputtering method and the Al film selectively deposited within opening are placed in excellent contact state which is durable electrically and mechanically because of the good surface property of Al film within the opening.

A memory cell having a capacitive element with a structure as shown in FIG. 24 was made. As shown in FIG. 25, firstly, an element separation region 702 was formed on an insulation film 2 on a semiconductor substrate 701.

Afterwards, to form a MOS transistor, a gate oxide film 732 was formed, and a polysilicon electrode 703 was formed thereon. As shown in FIG. 25, after forming a $SiO_2$ film as interlayer insulation film, an n-type layer 711 was formed, and a $Si_3N_4$ film 724 was deposited with the CVD. Then, the $SiO_2$ film 725 was further deposited with the CVD, and an opening was made thereon so as to expose the surface of n-type layer 711 with the resist patterning and reactive ion etching (RIE) (see FIG. 26).

The height 1 of pole in FIG. 24 could correspond to a depth of opening portion, which was 1.0 μm in this example.

Figure 27:
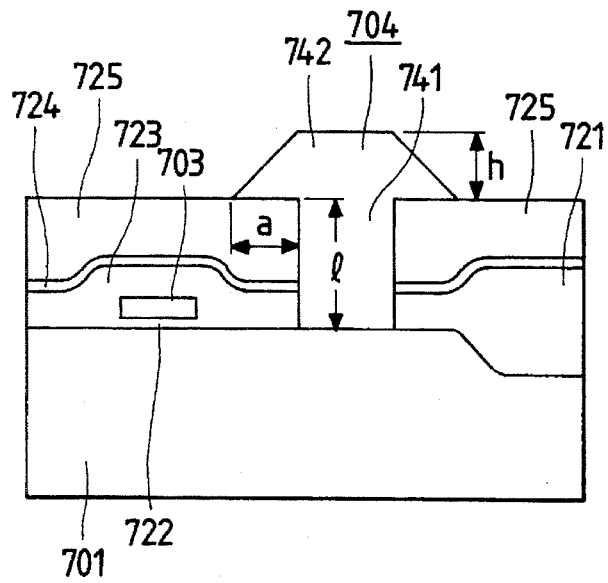

Next, after an upper portion of Al film exceeded an upper end of opening portion with previous selective CVD, deposition was also performed in a horizontal direction around Al pole, so as to make a trapezoidal pole having a bottom length a of 0.5 μm for the opening portion as shown in FIG. 27. At this time, the height h of trapezoid was 0.4 μm. Next, by removing selectively the $SiO_2$ film 725, Al monocrystal was exposed. Then, by dipping wafer to a solution of $H_2O_2:H_2O=1:1$, an $Al_2O_3$ film 751 having a thickness of 15A was formed on exposed surface of Al monocrystal 704. Then, by heating the substrate to a temperature of 350°, a $Si_3N_4$ film 752 was deposited in about 100 A thick, with the CVD method under reduced pressure using $NH_3$ gas and $SiH_4$ gas. Furthermore, Al was deposited on upper layer with ordinary CVD method to form an upper electrode 706 with the patterning.

A capacitive element of the present invention made in the above way occupied a projection area of 1.96 $\mu m^{2+}$ on the semiconductor substrate 1, with a surface area of 4.42 $\mu m^2$, whereby the capacity could be increased more than twice that of planar memory cell. Furthermore, since $Al_2O_3+Si_3N_4$ was used as the dielectric layer, the capacity was increased by 40%.

As above described, according to the present invention, since the first electrode has a lower layer portion on an electrical conductive lower surface, and an upper layer portion extending out in a direction from the lower layer portion along the lower surface, the projected plane area of the upper layer portion to the lower surface can be made larger than that of the lower layer portion, so that the surface area and capacity of the whole capacitive element can be increased. As above described, as the first electrode has a double layer structure, it is possible to increase greatly the degree of integration by making the effective use of a space on the lower surface located under an overhung portion of the upper layer portion as the space for other elements.

Also, according to the present invention, since the first electrode is formed with the metal deposition technique using new CVD method, it is possible to form an upper layer portion extending out in a direction along the lower surface by growing crystal of lower layer portion with a facet depending on the face orientations of lower layer portion and lower surface from an upper face of lower layer portion formed by depositing selectively a conductive material on the lower surface within opening.

The film forming method suitable for the present invention is to form a deposited film by the surface reaction on an electron-donative substrate by use of a gas of an alkylaluminum hydride and hydrogen gas (hereinafter called the Al-CVD method).

Particularly, by use of monomethylaluminum hydride (MMAH) as the starting gas or dimethylaluminum hydride (DMAH) as the starting gas, and $H_2$ gas as the reactive gas, and heating the substrate surface under the mixture of these gases, an Al film of good quality can be deposited. Here, during the selective deposition of Al, it is preferable to maintain the surface temperature at the decomposition temperature of the alkylaluminum hydride or higher and less than 450° C., more preferably 260° C. to 440° C.

As the method for heating the substrate to the above-mentioned temperature range, there are direct heating and indirect heating. Particularly, by maintaining the substrate at the above-mentioned temperature by direct heating, an Al film of good quality can be formed at high deposition speed. For example, when the substrate surface temperature during Al film formation is made 260° C. to 440° C. which is more preferable temperature range, a film of good quality can be obtained at higher deposition speed of 300 Å to 5000 Å/min. which is higher than in the case of resistance heating. As such direct heating method (substrate itself is heated by direct transmission of the energy from the heating means to the substrate), for example, lamp heating by means of halogen lamp, xenon lamp, etc. may be included. As the method for indirect heating, there is resistance heating, by which heating can be performed by use of a heat-generating body, etc. provided at the substrate supporting member for supporting the substrate to form deposited film arranged in the space for formation of the deposited film.

By applying the CVD method to the substrate having the electron-donative surface portion and the non-electron donative surface portion co-present thereon, a single crystal of Al is formed under good selectivity only on the electron-donative substrate surface portion. The Al thus formed will have all of excellent characteristics desirable for the electrode/wiring material. That is, reduction of generation probability of hillock, reduction of generation probability of alloy spike will be accomplished.

This may be considered to be due to the fact that substantially no or extremely small formation of alloy spike, etc. on account of the eutectic reaction with the subbing silicon, etc. is seen, because Al of good quality can be formed on the surface comprising a semiconductor or an electro-conductive member as the electron-donative surface, and also the Al is excellent in crystallinity. And, when employed for the electrode of a semiconductor device, an effect surpassing the concept of the Al electrode which has been contemplated in the prior art, and could not be even expected in the prior art can be obtained.

Having described above about the fact that the Al deposited on an electron-donative surface, for example, within the opening with the semiconductor substrate surface exposed becomes to have a single crystalline structure, according to the Al-CVD method, a metal film composed mainly of Al as described below can be also selectively deposited, and its film quality also exhibits excellent characteristics.

For example, in addition to a gas of an alkylaluminum hydride and hydrogen, a gas containing Si atoms such as $SiH_4$, $Si_2H_6$, $Si_3H_8$, $Si(CH_3)_4$, $SiCl_4$, $SiH_2Cl_2$, $SiHCl_3$, or the like, a gas containing Ti atoms such as $TiCl_4$, $TiBr_4$, $Ti(CH_3)_4$, etc., a gas containing Cu atoms such as copper bisacetylacetonate $Cu(C_5H_7O_2)$, copper bisdipivaloylmethanite $Cu(C_{11}H_{19}O_2)_2$, copper bishexafluoroacetylacetonate $Cu(C_5HF_6O_2)_2$, etc.

may be introduced in a suitable combination to form a gas mixture atmosphere, thereby forming an electrode by selective deposition of an electroconductive material such as Al—Si, Al—Ti, Al—Cu, Al—Si—Ti, Al—Si—Cu, etc.

The Al-CVD method as described above is a film forming method excellent in selectivity, and also the surface characteristic of the film formed has good surface characteristic. Hence, by application of a non-selective film forming method to the next deposition step, Al or a metal film composed mainly of Al can be also formed on the Al film selectively deposited as described above and $SiO_2$, etc. as the insulating film, whereby a suitable metal film having high usability for general purpose as the wiring of semiconductor device can be obtained.

Specific examples of such metal film include the following. There may be included combinations of Al, Al—Si, Al—Ti, Al—Cu, Al—Si—Ti, Al—Si—Cu, etc. deposited selectively with Al, Al—Si, Al—Ti, Al—Cu, Al—Si—Ti, Al—Si—Cu, etc.

As the film forming method for non-selective deposition, there are other CVD methods than the Al-CVD method as described above, the sputtering method, etc.

(Film forming Apparatus)

Next, a suitable film forming apparatus for forming the electrode according to the present invention is described.

Figure 28:
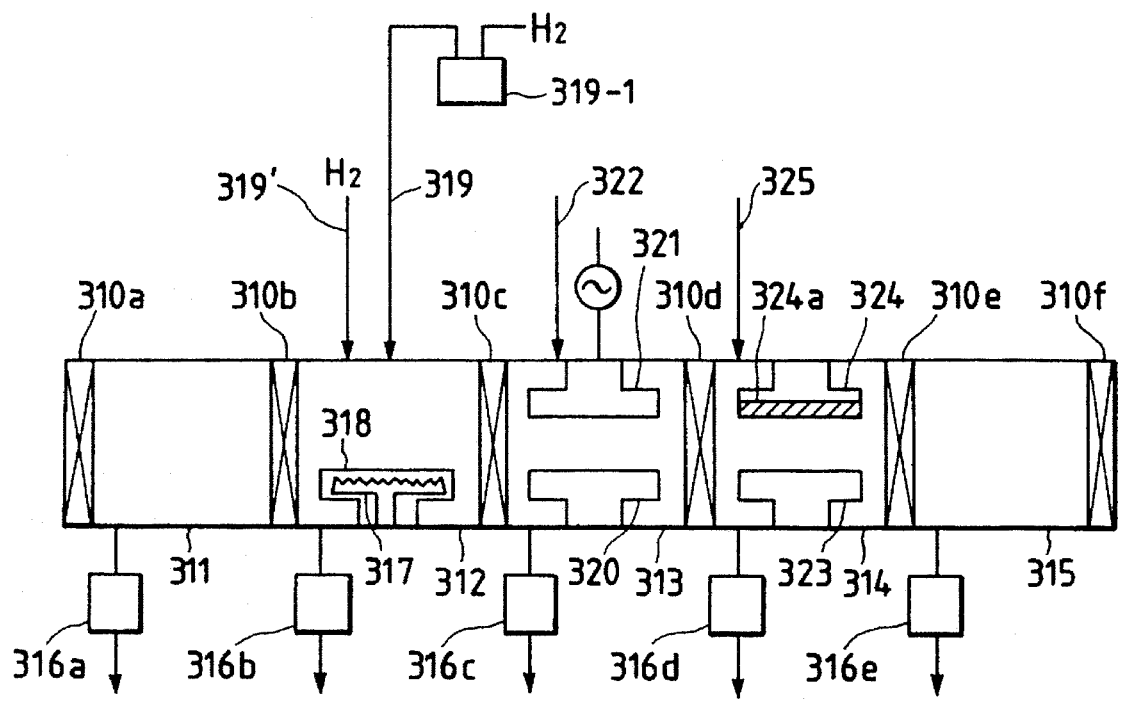
FIGS. 28 and 29 are typical views showing one example of a film forming apparatus used in carrying out a film forming method suitable for formation of an interconnection layer in a semiconductor device according to the present invention.
Figure 29:
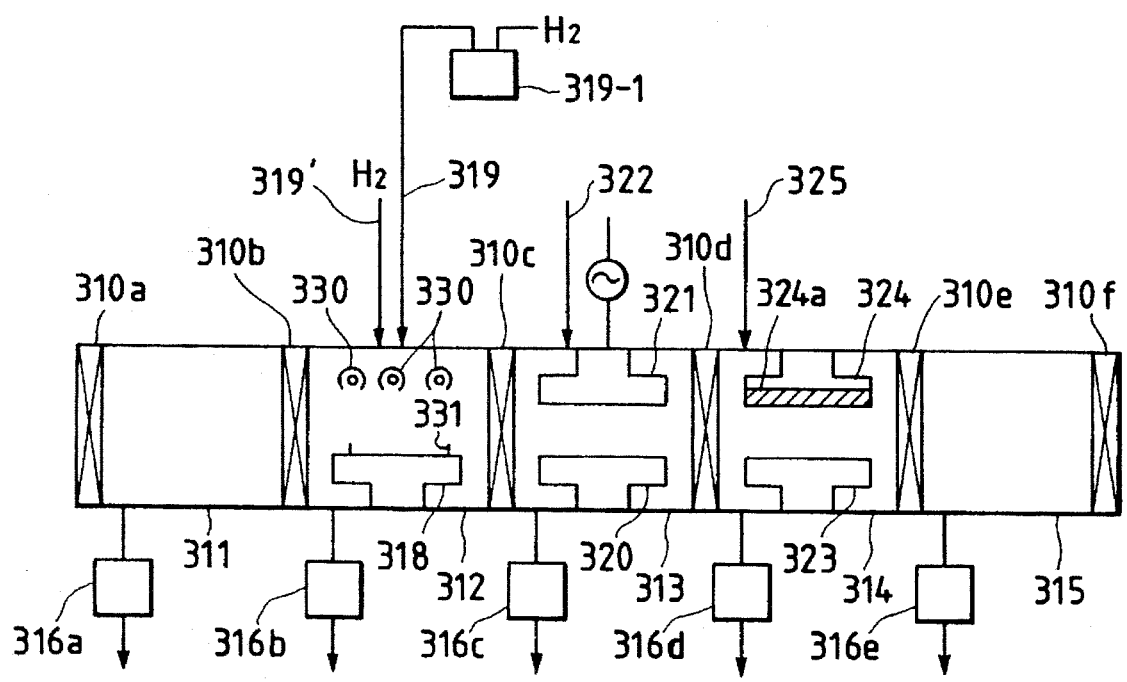
Figure 30:
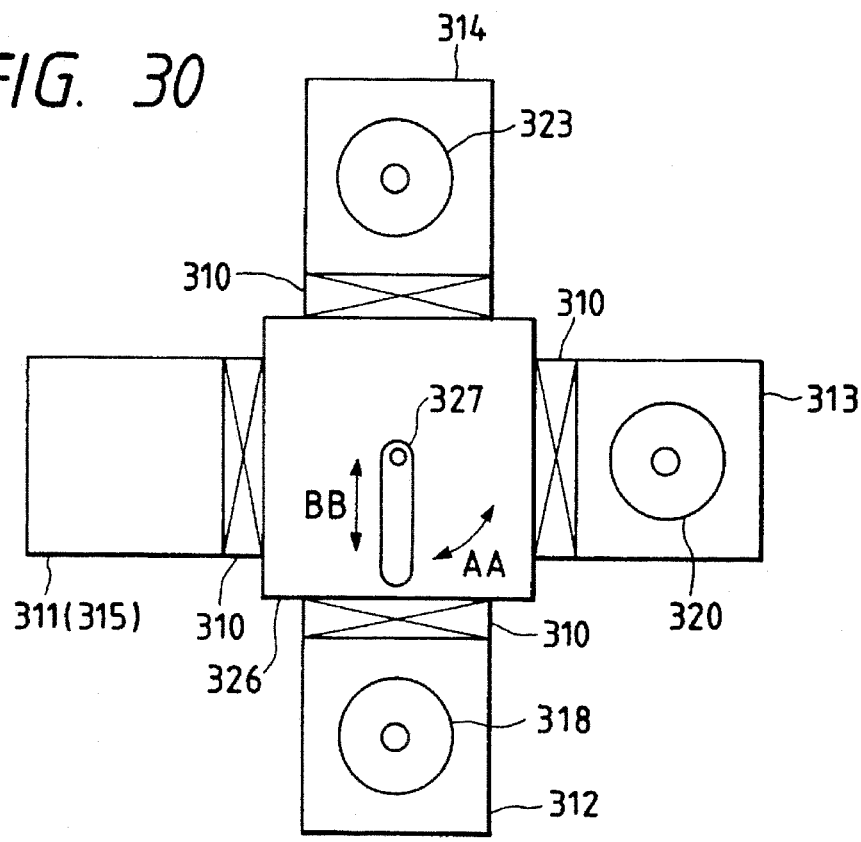
FIG. 30 is a schematic plan constitutional view of the apparatus as shown in FIGS. 28 and 29.

FIG. 28 to FIG. 30 show schematically a sequential metal film forming apparatus suitable for applying the film forming method as described above.

The sequential metal film forming apparatus, as shown in FIG. 28, is constituted of loadlock chamber 311 connected mutually communicated under shielding from outer air through the gate valves 310a to 310f, a CVD reaction chamber 312 as the first film forming chamber, an Rf etching chamber 313, a sputtering chamber 314 as the second film forming chamber and a loadlock chamber 315, and the respective chambers are constituted reducible in pressure by evacuation with the evacuation systems 316a to 316e. Here, the above loadlock chamber 311 is a chamber for replacing the substrate atmosphere before deposition treatment with $H_2$ atmosphere after evacuation in order to improve the throughput characteristic. The next CVD reaction chamber 312 is a chamber for selective deposition on the substrate according to the Al-CVD method as described above under normal pressure or reduced pressure, in which a substrate holder 318 having a heat-generating member 317 which can heat the substrate to be formed to a range of 200° C. to 450° C. is provided internally, and starting gases such as alkylaluminum hydride bubbled and gasified in the bubbler 319-1 are introduced into the chamber through the starting gas introducing line 319 for CVD, and also hydrogen gas as the reactive gas is introduced through the gasline 319'. The next Rf etching chamber 313 is a chamber for carrying out cleaning of the substrate surface after selective deposition (etching) under Ar atmosphere, and internally thereof are provided at least a substrate holder 320 capable of heating the substrate to a range of 100° C. to 250° C. and an electrode line for Rf etching 321, and also an Ar gas feeding line 322 is connected. The next sputtering chamber 314 is a chamber for depositing non-selectively a metal film by sputtering under Ar atmosphere on the substrate surface, and internally thereof are provided a substrate holder 323 heated within a range of 200° C. to 250° C. and a target electrode 324 for mounting a sputter target material 324a, and also an Ar gas feeding line 325 is connected. The final loadlock chamber 315 is a control chamber before taking out the substrate after completion of the metal film deposition into the outer air, and constituted so that the atmosphere may be replaced with $N_2$.

FIG. 29 shows another constitutional example of a sequential metal film forming apparatus suitable for applying the film forming method as described above, and the same portions as described above in FIG. 28 are made the same symbols. The difference of the apparatus in FIG. 29 from that in FIG. 28 resides in that a halogen lamp 330 is provided as the direct heating means and the substrate surface can be directly heated, and for that purpose, the substrate holder 312 is provided with a nail 331 for holding the substrate under suspended state.

By heating directly the substrate surface with such constitution, the deposition speed can be further improved as described above.

Figure 31:
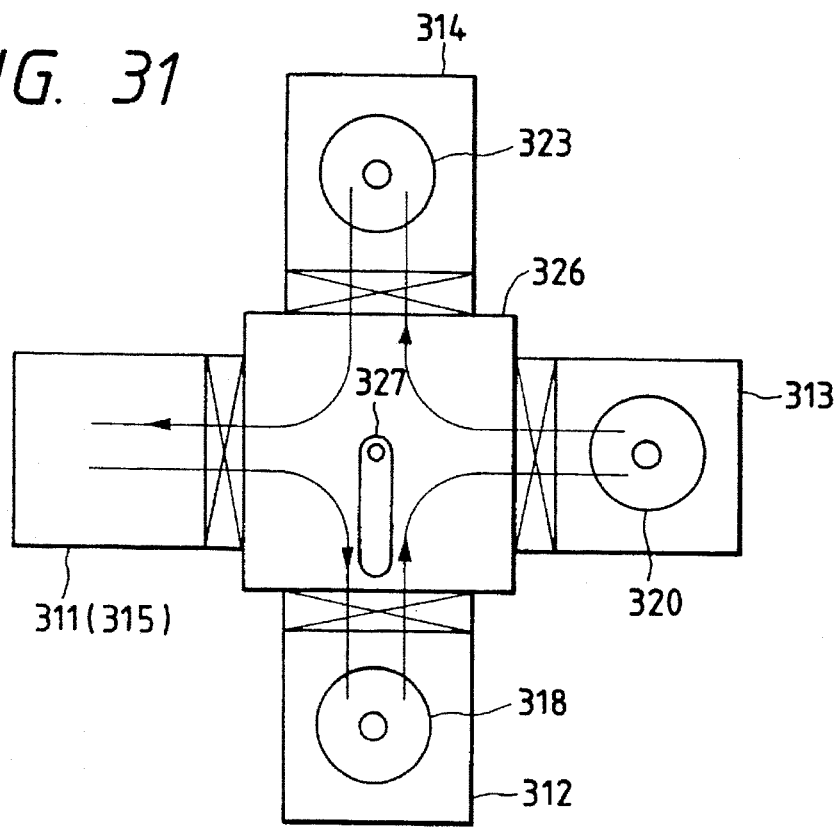
FIG. 31 is a schematic constitutional view adding the moving order of base body as shown in FIG. 30 by the arrow.

The sequential metal film forming apparatus with the above constitution, as shown in FIG. 30, is substantially equivalent to one with the structure having the above loadlock chamber 311, the CVD reaction chamber 312, the Rf etching chamber 313, the sputtering chamber 314, the loadlock chamber 315 connected mutually to one another with the conveying chamber 326 as the relay chamber. With this constitution, the loadlock chamber 311 functions also as the loadlock chamber 315. In the above conveying chamber 326, as shown in the Figure, an arm 327 as the conveying means reversibly rotatable in the AA direction and stretchable in the BB direction is provided, and with the arm 327, as shown in the arrowhead in FIG. 31, the substrate can be moved following the steps successively from the loadlock chamber 311 to the CVD chamber 312, the Rf etching chamber 313, the sputtering chamber 314, the loadlock chamber 315 without exposure to outer air.

(Film Forming Procedure)

The film forming procedure for forming the electrode and wiring according to the present invention is described.

FIGS. 32A to 32D are schematic perspective views for illustration of the film forming procedure for formation of the electrode and wiring according to the present invention.

First, the outline is described. A semiconductor substrate having openings formed on an insulating film is prepared, which substrate is arranged in a film forming chamber, and its surface is maintained at, for example, 260° C. to 450° C. to deposit selectively Al at the portion where the semiconductor is exposed according to the hot CVD method in a mixed atmosphere of DMAH as the alkylaluminum hydride and hydrogen gas. Of course, as described above, a metal film composed mainly of Al such as Al—Si, etc. may be also deposited selectively by introducing a gas containing Si atoms, etc. Next, on the Al selectively deposited by the sputtering method and the insulating film, Al or a metal film composed mainly of Al is non-selectively formed. Then, by patterning of the metal film non-selectively deposited to a desired wiring shape, electrodes and wirings can be formed.

Referring next to FIG. 29 to FIG. 32D, description is made in more detail. First, a substrate is prepared. As the substrate, for example, a single crystalline Si wafer having an insulating film provided with openings with respective apertures provided thereon is prepared.

Figure 32A:
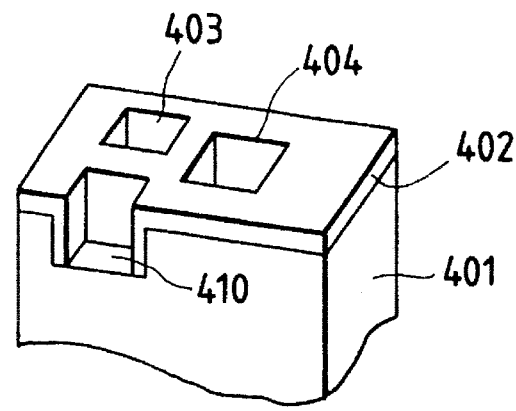
FIGS. 32A to 32D are typical views for explaining a film forming method suitable for formation of an interconnection layer in a semiconductor device according to the present invention.

FIG. 32A is a schematic view showing a part of the substrate. Here, 401 is a single crystalline silicon substrate as a conductive substrate, 402 a thermally oxidized silicon film as the insulating film (layer). 403 and 404 are openings (exposed portions), having apertures different from each other. 410 is the groove bottom with Si exposed.

The procedure for forming Al film which becomes the electrode as the first wiring layer on the substrate is as follows with FIGS. 32A to 32D.

First, the substrate as described above is arranged in the loadlock chamber 311. Hydrogen is introduced into the loadlock chamber 311 to make it under hydrogen atmosphere. And, the reaction chamber 312 is internally evacuated to approximately $1 \times 10^{-8}$ Torr by the evacuation system 316b. However, Al film can be formed even if the vacuum degree within the reaction chamber 312 may be worse than $1 \times 10^{-8}$ Torr.

And, the gas of DMAH bubbled from the gasline 319 is fed. For the carrier gas for the DMAH line, $H_2$ is employed.

The second gasline 319' is for $H_2$ as the reaction gas, and by flowing $H_2$ through the second gas line 319' and controlling the opening degree of the slow leak valve not shown to adjust the pressure within the reaction chamber 312 to a predetermined value. A typical pressure in this case is preferably about 1.5 Torr. Through the DMAH line, DMAH is introduced into the reaction tube. The total pressure is made about 1.5 Torr, and the DMAH pressure $5.0 \times 10^{-3}$ Torr. Then, current is passed to the halogen lamp 330 to heat directly the wafer. Thus, Al is selectively deposited.

After elapse of a predetermined deposition time, feeding of DMAH is once stopped. The predetermined deposition time of the Al film deposited in this process is the time until the thickness of the Al film on the Si (single crystalline silicon substrate 1) becomes equal to the film thickness of the $SiO_2$ (thermally oxidized silicon film 2), and can be determined previously by experimentation.

Figure 32B:
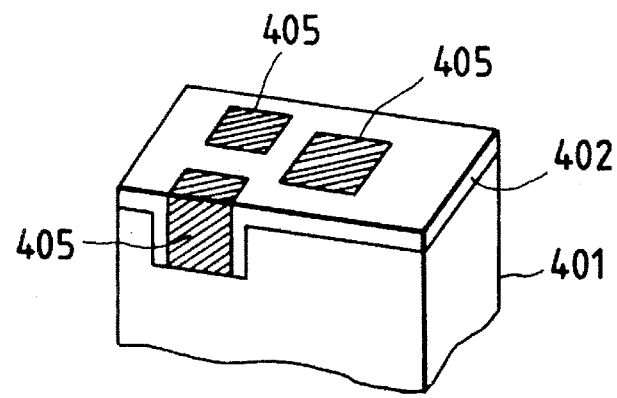
Figure 32C:
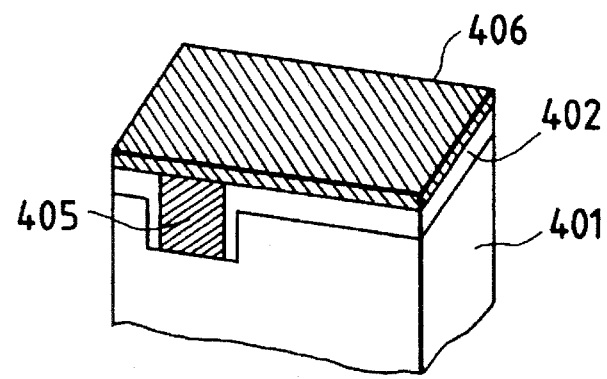

The temperature of the substrate surface by direct heating at this time is made about 270° C. According to the steps up to this stage, the Al film 405 is selectively deposited within the openings and the grooves as shown in FIG. 32B.

All of the steps as described above are referred to as the first film forming step for formation of electrode within contact hole.

After the above first film forming step, the CVD reaction chamber 312 is evacuated until reaching a vacuum degree of $5 \times 10^{-3}$ Torr or lower by the evacuation system 316b. At the same time, the Rf etching chamber 313 is evacuated to $5 \times 10^{-16}$ Torr or lower. After confirmation that the both chambers have reached the above vacuum degree, the gate valve 310c is opened, the substrate moved from the CVD reaction chamber 312 to the Rf etching chamber 313 by the conveying means, and the gate valve 310c closed. The substrate is conveyed to the Rf etching chamber 313, and the Rf etching chamber 313 is evacuated by means of the evacuation system 316c until reaching a vacuum degree of $10^{-6}$ Torr or lower. Then, argon is fed through the argon feeding line 322 for Rf etching, and the Rf etching chamber 313 maintained under an argon atmosphere of $10^{-1}$ to $10^{-3}$ Torr. The susbtrate holder 320 of Rf etching is maintained at about 200° C., Rf power of 100 W supplied to the electrode for Rf etching 321 for about 60 seconds, and discharging of argon is caused to occur within the Rf etching chamber 313 for about 60 seconds. By doing so, the surface of the substrate can be etched with argon ions to remove unnecessary surface layer of the CVD deposited film. The etching depth in this case is made about 100 Å in terms of the oxide. Here, surface etching of the CVD deposited film is effected in the Rf etching chamber, but since the surface layer of the CVD film of the substrate conveyed through vacuum contains no oxygen, etc., no Rf etching may be effected. In that case, the Rf etching chamber 313 function as the temperature changing chamber for effecting temperature change within a short time, when the temperatures in the CVD reaction chamber 12 and the sputtering chamber 314 are greatly different.

In the Rf etching chamber 313, after completion of Rf etching, flowing of argon is stopped, and the argon within the Rf etching chamber 313 is evacuated. After the Rf etching chamber 313 is evacuated to $5\times10^{-6}$ Torr and the sputtering chamber 314 to $5\times10^{-6}$ Torr or lower, the gate valve 310d is opened. Then, the substrate is moved from the Rf etching chamber 313 to the sputtering chamber 314 by means of a conveying means, followed by closing of the gate valve 310d.

pressure of 1.5 Torr, a DMAH partial pressure of $5.0\times10^{-3}$ Torr, the power amount passed through the halogen lamp is adjusted and the substrate surface temperature set within the range of 200° C. to 490° C. to form films.

The results are shown in Table 1.

TABLE 1

| Substrate surface temperature (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min.) | ← | 1000–1500 | → | ← | ← | ← | ← | 3000–5000 | → | → | → | → | → | → | → |
| Line defect of Si | ← | Not recognized | | → | → | → | → | → | → | → | → | → | → | → | → |
| Carbon content | ← | Not detected | | → | → | → | → | → | → | → | → | → | → | → | → |
| Resistivity (μΩcm) | ← | 2.7–3.3 | → | ← | ← | ← | ← | ← | 2.8–3.4 | → | → | → | → | → | → |
| Reflectance (%) | ← | 85–95 | | → | ← | ← | ← | 90–95 | | → | ← | ← | ~60 | → | → |
| Hillock density of 1 μm or more (cm$^{-2}$) | ←1–10$^2$ | | → | ← | ← | ← | ← | 0–10 | | → | ← | –10–10$^4$ | | → | → |
| Spike generation (%) (destruction probability of 0.15 μm junction) | ← | 0 | → | → | → | → | → | → | → | → | ← | 0–30 | | → | → |

After the substrate is conveyed to the sputtering chamber 314, the sputtering chamber 314 is made under an argon atmosphere of $10^{-1}$ to $10^{-3}$ Torr similarly as in the Rf etching chamber 313, and the temperature of the substrate holder 323 for mounting the substrate set to about 200° to 250° C. And discharging of argon is effected at a DC power of 5 to 10 kw to cut a target material such as Al or Al—Si (Si: 0.5%) and effect film formation of a metal such as Al, Al—Si, etc. at a deposition speed of about 10000 Å/min. on the substrate. This step is a non-selective deposition step. This is called the second film forming step for formation of the wiring to be connected to the electrode.

After formation of a metal film of about 5000 Å, flowing of argon and application of DC power are stopped. After evacuation of the loadlock chamber 311 to $5\times10^{-3}$ Torr or lower, the gate valve 310e is opened and the substrate moved. After the gate valve 310e is closed, $N_2$ gas is permitted to flow into the loadlock chamber 311 until reaching atmospheric pressure, the gate valve 310f opened and the substrate taken out of the apparatus.

According to the second Al film deposition step as described above, the Al film 406 can be formed on the $SiO_2$ film 402.

Figure 32D:
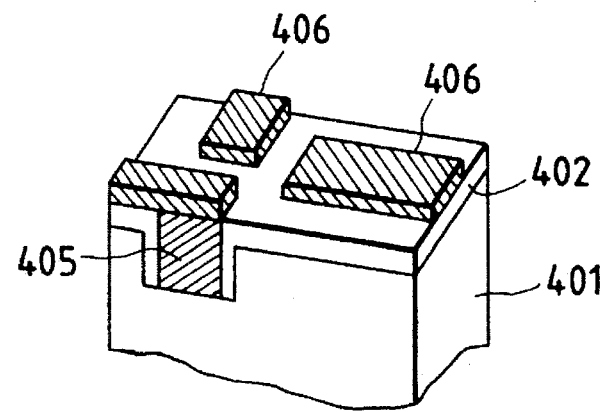

And, by patterning the Al film 406 as shown in FIG. 32D, a wiring with a desired shape can be obtained.

(Experimental Examples)

In the following, how excellent is the above-described Al-CVD method is and how good of the quality the Al film deposited within the openings is are described based on the experimental results.

First, as the substrate, a plurality of N-type single crystalline silicon wafers were prepared, which are thermally oxidized on the surface to form $SiO_2$ of 8000 Å, and have various openings with various apertures from 0.25 μm×0.25 μm square to 100 μm×100 μm square patterned to have the subbing Si single crystal exposed (Sample 1-1).

These are subjected to formation of Al films according to the Al-CVD method under the conditions as described below. Under the common conditions by use of DMAH as the starting gas, and hydrogen as the reaction gas, a total As can be seen from Table 1, at a substrate surface temperature by direct heating of 260° C. or higher, Al is deposited selectively at a high deposition speed of 3000 to 5000 Å/min. within the openings.

When the characteristics of the Al film within the openings at substrate surface temperature range of 260° C. to 440° C. are examined, they are found to be excellent such that no carbon is contained, with resistivity being 2.8 to 3.4 μΩcm, reflectance 90 to 95%, hillock density of 1 μm or higher 0 to 10 and substantially no spike generation (destruction probability of 0.15 μm junction).

In contrast, at substrate surface temperatures of 200° C. to 250° C., the film is found to be considerably good as compared with the prior art although the film quality is slightly worse as compared with the case of 260° C. to 440° C., but the deposition speed is 1000 to 1500 Å/min., which can never be said to be sufficiently high.

When the substrate surface temperature becomes 450° C. or higher, the characteristics of the Al film with the openings are lowered with the reflectance becoming 60% or less, hillock density of 1 μm or more 10 to $10^4$ cm$^{-2}$, alloy spike generation 0 to 30%.

Next, description is made about how suitably the method as described above can be used openings such as contact hole or thru-hole.

That is, it can be also preferably applied to the contact hole/thru-hole structure comprising the material as described below.

On the sample 1-1 as described above, an Al film is formed on a substrate (sample) as described below under the same conditions as when the Al film is formed.

On a single crystalline silicon as the first substrate surface material is formed a silicon oxide film according to the CVD method as the second substrate surface material, and patterning effected according to the photolithographic steps to have the single crystalline silicon surface partially exposed.

The film thickness of the thermally oxidized $SiO_2$ film has a film thickness of 8000 Å, the exposed portion of the single crystalline silicon a size of 0.25 μm×0.25 μm to 100 μm×100 μm. Thus, sample 1-2 is prepared (hereinafter such samples are represented as "CVD $SiO_2$ (hereinafter abbreviated as $SiO_2$)/single crystalline silicon").

Sample 1-3 is boron doped oxide film formed by normal pressure CVD (hereinafter abbreviated as BSG)/single crystalline silicon, sample 1-4 phosphorus doped oxide film formed by normal pressure CVD (hereinafter abbreviated as PSG)/ single crystalline silicon, sample 1-5 phosphorus and boron doped oxide film formed by normal pressure CVD (hereinafter abbreviated as BSPG)/single crystalline silicon, sample 1-6 nitride film formed by plasma CVD (hereinafter abbreviates as P-SiN)/single crystalline silicon, sample 1-7 hot nitride film (hereinafter abbreviated as T-SiN)/single crystalline silicon, sample 1-8 nitride film formed by low pressure CVD (hereinafter abbreviated as LP-SiN)/single crystalline silicon, sample 1-9 nitride film formed by means of an ECR apparatus (hereinafter abbreviated as ECR-SiN)/single crystalline silicon.

Further, according to all combinations of the first substrate surface materials (18 kinds) and the second substrate surface materials (9 kinds), samples 1-11 to 1-179 (note: sample Nos. 1-10, 20, 30, 40, 50, 60, 70, 80, 90, 100, 110, 120, 130, 140, 150, 160, 170 are lacking) are prepared. As the first substrate surface material, single crystalline silicon (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (Ti—N), copper (Cu), aluminum silicon copper (Al—Si—Cu), aluminum palladium (Al—Pd), titanium (Ti), molybdenum silicide (Mo—Si), tantalum silicide (Ta—Si) are employed. As the second substrate surface material, $T-SiO_2$, $SiO_2$, BSG, PSG, BPSG, P-SiN, T-SiN, LP-SiN, ECR-SiN are employed. For all of the samples as described above, good Al films comparable with the sample 1-1 could be formed.

Next, on the substrate having Al deposited selectively as described above, Al is deposited non-selectively according to the sputtering method as described above, followed by patterning.

As the result, the Al film formed according to the sputtering method, and the Al film selectively selected within the openings are found to be under the contact state with both electrically and mechanically high durability due to good surface characteristic of the Al film.

We claim:

1. A semiconductor device comprising:

a semiconductor body having a diffusion region for constituting a transistor; and a capacitor comprising a first electrode connected to said diffusion region, and an opposing electrode provided with regard to said electrode with a dielectric layer interposed therebetween;

wherein said first electrode is producible by single crystalline Al and comprises a first region filling a contact hole in an insulating layer, wherein said first region comprises a single crystalline Al with a plane (111) formed on a plane (100) of a semiconductor body comprising a single crystalline Si, and a second region elongated horizontally from said contact hole on said insulating layer.

* * * * *

UNITED STATES PATENT AND TRADEMARK OFFICE
CERTIFICATE OF CORRECTION

PATENT NO. : 5,541,454

DATED : July 30, 1996

INVENTORS : SHUNSUKE INOUE ET AL.

It is certified that error appears in the above-identified patent and that said Letters Patent is hereby corrected as shown below:

COLUMN 2

Line 60, "film 2" should read --film 28--.

COLUMN 3

Line 6, "consistent, in" should read --consistent. In--;

Line 17, "(thereafter" should read --(hereafter--.

COLUMN 5

Line 63, "equivalanet" should read --equivalent--.

COLUMN 8

Table 1 "Many exists" should read --Many exist--.

COLUMN 10

Line 51, "that" should read --than the--.

UNITED STATES PATENT AND TRADEMARK OFFICE
CERTIFICATE OF CORRECTION

PATENT NO. : 5,541,454

DATED : July 30, 1996

INVENTORS : SHUNSUKE INOUE ET AL.

It is certified that error appears in the above-identified patent and that said Letters Patent is hereby corrected as shown below:

COLUMN 17

Line 13, "is" should read --is a--; (second occurrence).
Line 49, "becomes" should read --comes--;
Line 62, "etc." should read --etc.,--.

COLUMN 20

Line 63, "function" should read --functions--.

Signed and Sealed this

Seventeenth Day of December, 1996

Attest:

BRUCE LEHMAN

Attesting Officer    Commissioner of Patents and Trademarks